(12) United States Patent
Park et al.

(10) Patent No.: US 12,431,442 B2
(45) Date of Patent: Sep. 30, 2025

(54) SEMICONDUCTOR CHIPS HAVING RECESSED REGIONS

(71) Applicant: Samsung Electronics Co., Ltd., Suwon-si (KR)

(72) Inventors: Jinduck Park, Asan-si (KR); Chansik Kwon, Asan-si (KR); Yongseong Kim, Asan-si (KR); Inwook Im, Cheonan-si (KR); Jiyeon Han, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 469 days.

(21) Appl. No.: 17/704,177

(22) Filed: Mar. 25, 2022

(65) Prior Publication Data
US 2023/0096434 A1 Mar. 30, 2023

(30) Foreign Application Priority Data
Sep. 29, 2021 (KR) .................. 10-2021-0128886

(51) Int. Cl.
H01L 23/52 (2006.01)
H01L 23/00 (2006.01)
H01L 23/522 (2006.01)
H01L 23/528 (2006.01)

(52) U.S. Cl.
CPC ........ *H01L 23/562* (2013.01); *H01L 23/5226* (2013.01); *H01L 23/528* (2013.01)

(58) Field of Classification Search
CPC . H01L 23/562; H01L 23/5226; H01L 23/528; H01L 23/3128; H01L 23/3192; H01L 23/585; H01L 23/3171; H01L 24/02; H01L 2224/02371; H01L 2224/02372
See application file for complete search history.

(56) References Cited

U.S. PATENT DOCUMENTS

| | | | |
|---|---|---|---|
| 6,444,544 B1 * | 9/2002 | Hu | H01L 23/585 438/467 |
| 7,374,971 B2 | 5/2008 | Yuan et al. | |
| 8,053,337 B2 | 11/2011 | Noda | |
| 8,154,133 B2 | 4/2012 | Koroku et al. | |

(Continued)

FOREIGN PATENT DOCUMENTS

| CN | 113451265 A * | 9/2021 | ............. H01L 23/29 |
|---|---|---|---|
| KR | 2012-0092638 A | 8/2012 | |
| KR | 10-2020-0032299 A | 3/2020 | |

OTHER PUBLICATIONS

Office Action for Corresponding Korean Application No. 10-2021-0128886 issued on Aug. 1, 2025.

Primary Examiner — Ida M Soward
(74) Attorney, Agent, or Firm — Harness, Dickey & Pierce, P.L.C.

(57) ABSTRACT

A semiconductor chip includes a semiconductor substrate including a device region, and an edge region surrounding the device region, a device layer on the semiconductor substrate, a wiring layer on the device layer, a side surface of the wiring layer at least partially defining a recessed region that is in the edge region such that the side surface of the wiring layer is exposed by the recessed region, and an upper insulating layer on the wiring layer. The recessed region extends from a side surface of the device layer toward the device region. A first portion of the upper insulating layer covers the side surface of the wiring layer that is exposed by the recessed region.

20 Claims, 27 Drawing Sheets

(56) References Cited

U.S. PATENT DOCUMENTS

| | | |
|---|---|---|
| 9,355,967 B2 | 5/2016 | Kim et al. |
| 10,978,537 B2* | 4/2021 | Ebisuno ............... H10K 59/121 |
| 11,063,237 B2* | 7/2021 | Kim .................... H10D 86/423 |
| 11,581,514 B2* | 2/2023 | Kim .................... H10K 50/844 |
| 11,765,928 B2* | 9/2023 | Lee .................... H10K 59/1216 |
| 2004/0245642 A1 | 12/2004 | Hasunuma et al. |
| 2009/0283311 A1* | 11/2009 | Ida .................... H01L 27/14683 |
| | | 29/846 |
| 2011/0089581 A1 | 4/2011 | Pol et al. |
| 2013/0001787 A1* | 1/2013 | Yoshizawa ............ H01L 23/564 |
| | | 257/E23.072 |
| 2014/0048926 A1 | 2/2014 | Wang et al. |
| 2016/0204074 A1* | 7/2016 | Lin ....................... H01L 21/784 |
| | | 257/76 |
| 2016/0293687 A1* | 10/2016 | Chang .................. H10K 59/121 |
| 2019/0214595 A1* | 7/2019 | Park ..................... G06F 3/0446 |
| 2021/0175133 A1* | 6/2021 | Choi ..................... H01L 23/544 |
| 2021/0305115 A1* | 9/2021 | Choi ................. H01L 23/53295 |
| 2021/0359051 A1* | 11/2021 | Jin ....................... H10K 59/124 |
| 2022/0028804 A1* | 1/2022 | Mitsuhashi ............ H01L 23/562 |
| 2022/0165652 A1* | 5/2022 | Han ................. H01L 23/49816 |

* cited by examiner

SEMICONDUCTOR CHIPS HAVING RECESSED REGIONS

CROSS-REFERENCE TO RELATED APPLICATION

This application claims priority from Korean Patent Application No. 10-2021-0128886, filed on Sep. 29, 2021, in the Korean Intellectual Property Office, the disclosure of which is incorporated herein by reference in its entirety.

BACKGROUND

1. Field

The example embodiments of the inventive concepts relate to semiconductor chips having recessed regions.

2. Description of the Related Art

A semiconductor chip is manufactured using a sawing process for cutting a semiconductor substrate formed with an integrated circuit device.

SUMMARY

Some example embodiments of the inventive concepts provide a semiconductor chip having a recessed region, and a cover portion covering the recessed region. The semiconductor chip may have enhanced stability and reliability and configured to reduce or prevent the likelihood of failure in a sawing process.

A semiconductor chip according to some example embodiments of the inventive concepts may include a semiconductor substrate including a device region, and an edge region surrounding the device region, a device layer on the semiconductor substrate, a wiring layer on the device layer, wherein a side surface of the wiring layer at least partially defines a recessed region that is in the edge region such that the side surface of the wiring layer is exposed by the recessed region, and an upper insulating layer on the wiring layer. The recessed region may extend from a side surface of the device layer toward the device region. A first portion of the upper insulating layer may cover the side surface of the wiring layer that is exposed by the recessed region.

A semiconductor chip according to some example embodiments of the inventive concepts may include a semiconductor substrate including a device region, and an edge region surrounding the device region, a device layer on the semiconductor substrate, a wiring layer on the device layer, a side surface of the wiring layer at least partially defining a recessed region that is in the edge region such that the side surface of the wiring layer is exposed by the recessed region, a cover structure covering the side surface of the wiring layer exposed by the recessed region, and an upper insulating layer on the wiring layer. The recessed region may extend from a side surface of the device layer toward the device region.

A semiconductor package according to some example embodiments of the inventive concepts may include a package substrate including an upper pad and an outer connection terminal, the upper pad being at an upper surface of the package substrate, and the outer connection terminal being at a bottom surface of the package substrate, a semiconductor chip on the package substrate, a bonding wire connecting the semiconductor chip to the upper pad, an adhesive member that is between the package substrate and the semiconductor chip, and an encapsulator covering the package substrate and the semiconductor chip. The semiconductor chip may include a semiconductor substrate including a device region, and an edge region surrounding the device region, a device layer on the semiconductor substrate, a wiring layer on the device layer, a side surface of the wiring layer at least partially defining a recessed region that is in the edge region such that the side surface of the wiring layer is exposed by the recessed region, and an upper insulating layer on the wiring layer. The recessed region may extend from a side surface of the device layer toward the device region. A portion of the upper insulating layer may cover the side surface of the wiring layer that is exposed by the recessed region.

DETAILED DESCRIPTION

Figure 1:
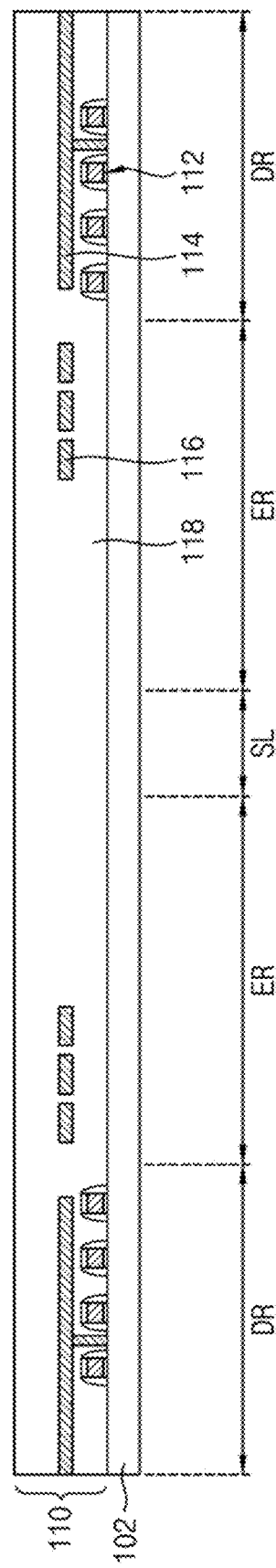
FIGS. 1, 2, 3, 4, 5, and 6 are vertical sectional views illustrating in process order of a method of manufacturing a semiconductor chip according to some example embodiments of the inventive concepts.

Hereinafter, some example embodiments according to the spirit and scope of the present inventive concepts will be described with reference to the accompanying drawings. In the description of FIGS. 1 to 19, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIGS. 1, 2, 3, 4, 5, and 6 are vertical sectional views illustrating in process order of a method of manufacturing a semiconductor chip according to some example embodiments of the inventive concepts. FIG. 7 is a vertical sectional view of a semiconductor chip according to some example embodiments of the inventive concepts.

Referring to FIG. 1, a device layer 110 may be formed on a semiconductor substrate 102. The semiconductor substrate 102 may include device regions DR, edge regions ER, and a cutting region SL. The cutting region SL may represent a portion to be removed in a cutting process which will be described later. The edge regions ER may be disposed between the cutting region SL and the device regions DR. The semiconductor substrate 102 may include a semiconductor material. For example, the semiconductor substrate 102 may be a silicon substrate, a germanium substrate, a silicon germanium substrate, or a silicon-on-insulator (SOI) substrate.

The device layer 110 may include devices 112, wirings 114 and 116, and a lower interlayer insulating layer 118. The devices 112 may include a memory cell array including switching elements and data storage elements, and logic devices including a MOSFET, a capacitor and a resistor. The wiring 114 may be disposed on the devices 112, and may be electrically connected to at least one of the devices 112. The devices 112 and the wiring 114 may be disposed in the device region DR. The wiring 116 may be disposed in the edge region ER, and may be electrically isolated. The lower interlayer insulating layer 118 may cover the semiconductor substrate 102, the devices 112, and the wirings 114 and 116. The wirings 114 and 116 may include copper (Cu), aluminum (Al), tungsten (W), nickel (Ni), titanium (Ti), titanium nitride (TiN), tantalum (Ta), tantalum nitride (TaN), gold (Au), or a combination thereof. In some example embodiments, the lower interlayer insulating layer 118 may include silicon oxide, silicon nitride, silicon oxynitride, or a combination thereof.

Figure 2:
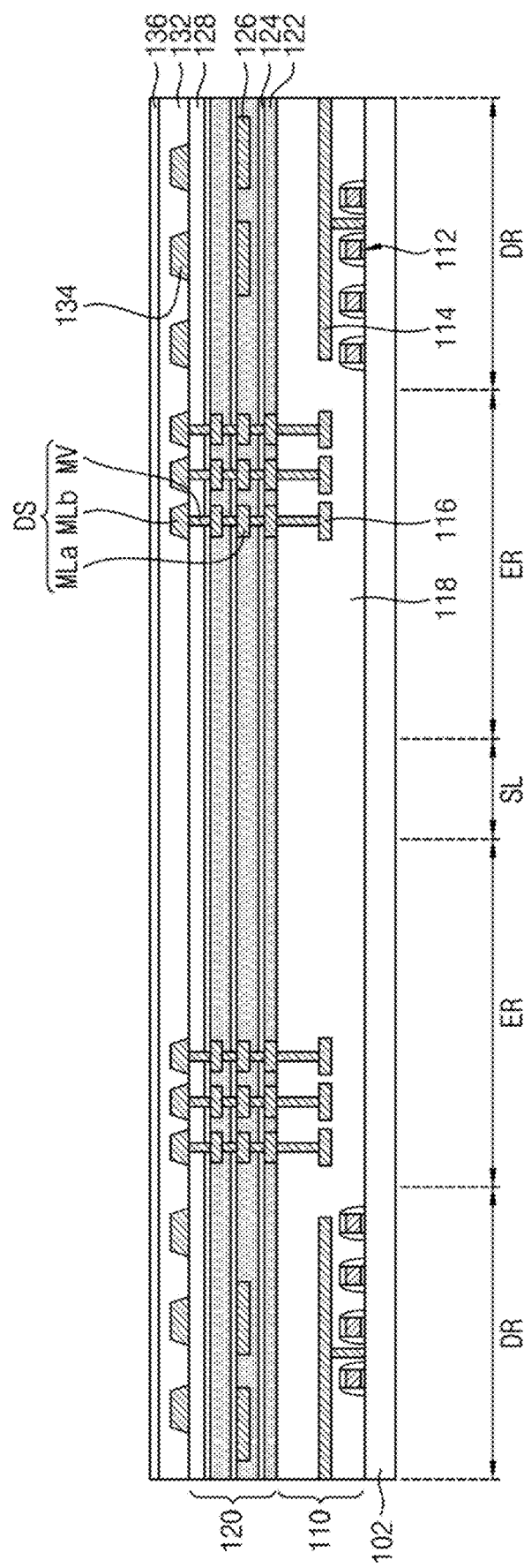

Referring to FIG. 2, a wiring layer 120, a first upper insulating layer 132, a chip pad 134, and a second upper insulating layer 136 may be formed on the device layer 110. The wiring layer 120 may include a first lower insulating layer 122, a second lower insulating layer 124, a lower wiring 126, and an upper interlayer insulating layer 128. First lower insulating layers 122 may be deposited alternately with second lower insulating layers 124. For example, a lowermost one of the first lower insulating layers 122 may contact the lower interlayer insulating layer 118, and the second lower insulating layers 124 may be disposed on the first lower insulating layers 122, respectively. The upper interlayer insulating layer 128 may be disposed at an upper portion of the wiring layer 120, and may contact the second lower insulating layer 124. The lower wiring 126 may be disposed in the device region DR, and may be buried in the wiring layer 120. For example, the lower wiring 126 may be disposed in at least one of the first lower insulating layers 122. The lower wiring 126 may be electrically connected to the device 112.

The first lower insulating layer 122, the second lower insulating layer 124, and the upper interlayer insulating layer 128 may include a low dielectric material having a low dielectric constant. For example, the first lower insulating layer 122 may include silicon oxide doped with an impurity or an organic polymer. In some example embodiments, the first lower insulating layer 122 may include SiOCH. The second lower insulating layer 124 may include SiCN, and the upper interlayer insulating layer 128 may include silicon oxide.

The wiring layer 120 may further include lower metal lines MLa and metal vias MV which are disposed in the edge region ER. The lower metal lines Mla may be formed in the first lower insulating layers 122, and may form a plurality of layers. The lower metal line Mla may also be connected to the wiring 116 in the lower interlayer insulating layer 118. The metal vias MV may extend in a vertical direction, and may interconnect the lower metal lines Mla of different levels. In some example embodiments, the lower wiring 126, the lower metal lines Mla and the metal vias MV may be formed by a dual damascene process. The wiring layer 120 may further include a barrier material disposed at surfaces of the lower wiring 126, the lower metal lines Mla and the metal vias MV. The lower wirings 126, the lower metal lines Mla and the metal vias MV may include copper (Cu), aluminum (Al), tungsten (W), nickel (Ni), titanium (Ti), titanium nitride (TiN), tantalum (Ta), tantalum nitride (TaN), gold (Au), or a combination thereof. For example, the lower wirings 126, the lower metal lines Mla and the metal vias MV may include copper (Cu).

In the present specification, the term 'level' may mean a vertical height and/or a distance from a reference location (e.g., one or more of an upper surface of the semiconductor substrate 102, a lower surface of the semiconductor substrate 102, or the like) in a vertical direction (e.g., a vertical direction that extends perpendicular or substantially perpendicular to at least one of the upper surface of the semiconductor substrate 102, the lower surface of the semiconductor substrate 102, or the like). For example, when a first element is described herein to be at a higher level than a second element, the first element may be further from the reference location in the vertical direction than the second element. In another example, when a first element is described herein to be at a lower level than a second element, the first element may be closer to the reference location in the vertical direction than the second element. In another example, when a first element is described herein to be at a same level as a second element, the first element may be equally distant from/close to the reference location in the vertical direction as the second element.

After formation of the wiring layer 120, the chip pad 134 may be formed on the upper interlayer insulating layer 128. In addition, a metal pattern may further be formed on the upper interlayer insulating layer 128, together with the chip pad 134. The chip pad 134 and the metal pattern may be formed by forming a conductive material on the upper interlayer insulating layer 128, and then patterning the conductive material. The chip pad 134 may be disposed in the device region DR, and may be electrically connected to the lower wiring 126. From among metal patterns, the metal pattern disposed in the edge region ER and connected to the lower metal line Mla may be referred to as an upper metal line MLb. The upper metal line MLb may be connected to the lower metal line Mla by the metal via MV. The lower metal lines Mla, the upper metal line MLb, and the metal vias MV may constitute a dam structure DS. Although three lower metal lines Mla, three upper metal lines MLb and three metal vias MV are shown in FIG. 2 as being disposed at different levels, respectively, the example embodiments of the inventive concepts are not limited thereto. The entirety of one or more lower metal lines Mla, one or more upper metal lines MLb and one or more metal vias MV respectively disposed at different levels may be referred to as a dam structure DS. The dam structure DS may extend in a horizontal direction to surround the device region DR. The dam structure DS may be electrically isolated from the wiring 114, the lower wiring 126 and the chip pad 134. The chip pad 134 and the upper metal line MLb may include copper (Cu), aluminum (Al), tungsten (W), nickel (Ni), titanium (Ti), titanium nitride (TiN), tantalum (Ta), tantalum nitride (TaN), gold (Au), or a combination thereof. For example, the chip pad 134 and the upper metal line MLb may include aluminum (Al).

The first upper insulating layer 132 may cover the wiring layer 120, the chip pad 134 and the upper metal line MLb, and the second upper insulating layer 136 may cover the first upper insulating layer 132. Although the second upper insulating layer 136 is shown as being flat, the example embodiments of the inventive concepts are not limited thereto. In some example embodiments, portions of the second upper insulating layer 136 corresponding to the chip pad 134 and the upper metal line MLb may protrude upwards. The second upper insulating layer 136 may include a material having etch selectivity with respect to the first upper insulating layer 132. For example, the first upper insulating layer 132 may include high-density plasma (HDP) oxide, and the second upper insulating layer 136 may include silicon nitride.

Figure 3:
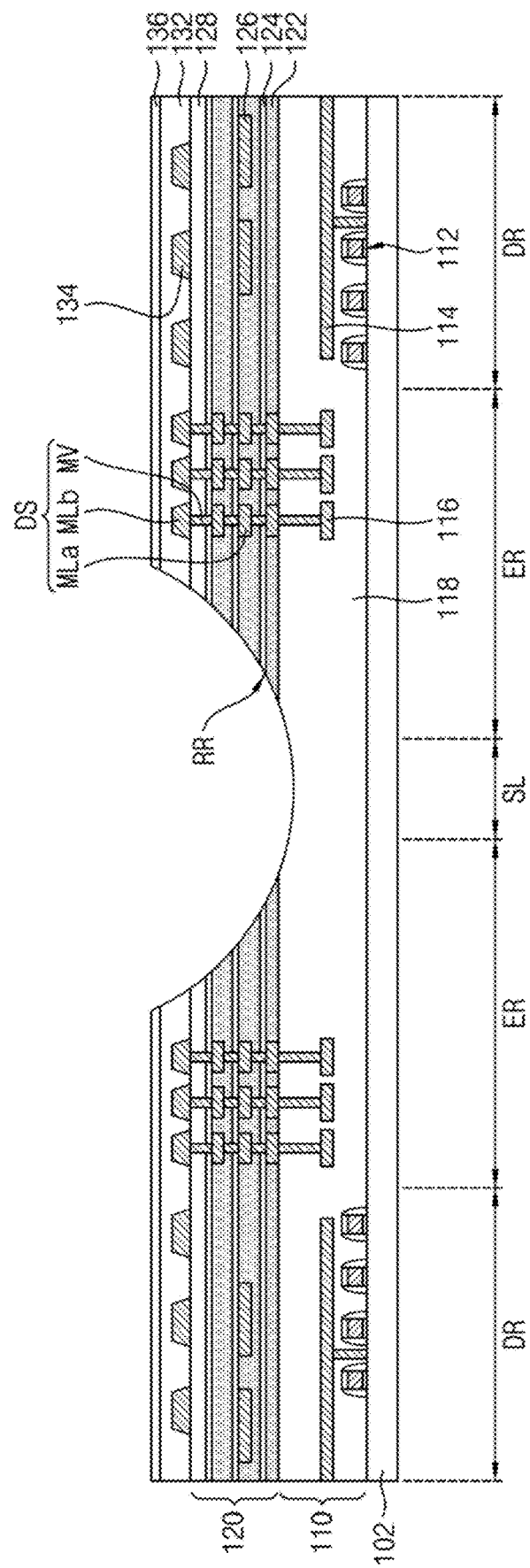

Referring to FIG. 3, an etching process for etching the wiring layer 120, the first upper insulating layer 132 and the second upper insulating layer 136 may be performed. By the etching process, a recessed region RR may be formed in the cutting region SL and the edge region ER. As shown, the recessed region RR may be at least partially defined by respective surfaces of at least the wiring layer 120. As further shown, the recessed region RR may be at least partially defined by one or more surfaces of at least the device layer 110 (e.g., an exposed upper surface of the interlayer insulating layer 118). Accordingly, it will be understood that, in some example embodiments, the wiring layer 120 may at least partially define a recessed region RR that is in at least the edge region ER and exposes at least a side surface of the wiring layer 120 which may be a surface that a t least partially defines the recessed region RR. It will be understood that surfaces that are described herein to be "exposed" by the recessed region RR may be understood to be surfaces that at least partially define the recessed region RR. In the cutting region SL, the wiring layer 120, the first upper insulating layer 132 and the second upper insulating layer 136 may be completely cut, and an upper surface of the lower interlayer insulating layer 118 may be exposed. In some example embodiments, the upper surface of the lower interlayer insulating layer 118 may be partially etched. For example, a lower end of the recessed region RR may be disposed at a lower level than the upper surface of the lower interlayer insulating layer 118. In some example embodiments, the lower interlayer insulating layer 118 may not be etched, and the lower end of the recessed region RR may be disposed at the same level as the upper surface of the lower interlayer insulating layer 118. In the edge region ER, the wiring layer 120, the first upper insulating layer 132 and the second upper insulating layer 136 may be partially etched. In cross-sectional view, the recessed region RR may be rounded. An upper end of the recessed region RR may be disposed at the same level as an upper surface of the second upper insulating layer 136. The recessed region RR may extend in the horizontal direction to surround the device region DR.

Figure 4:
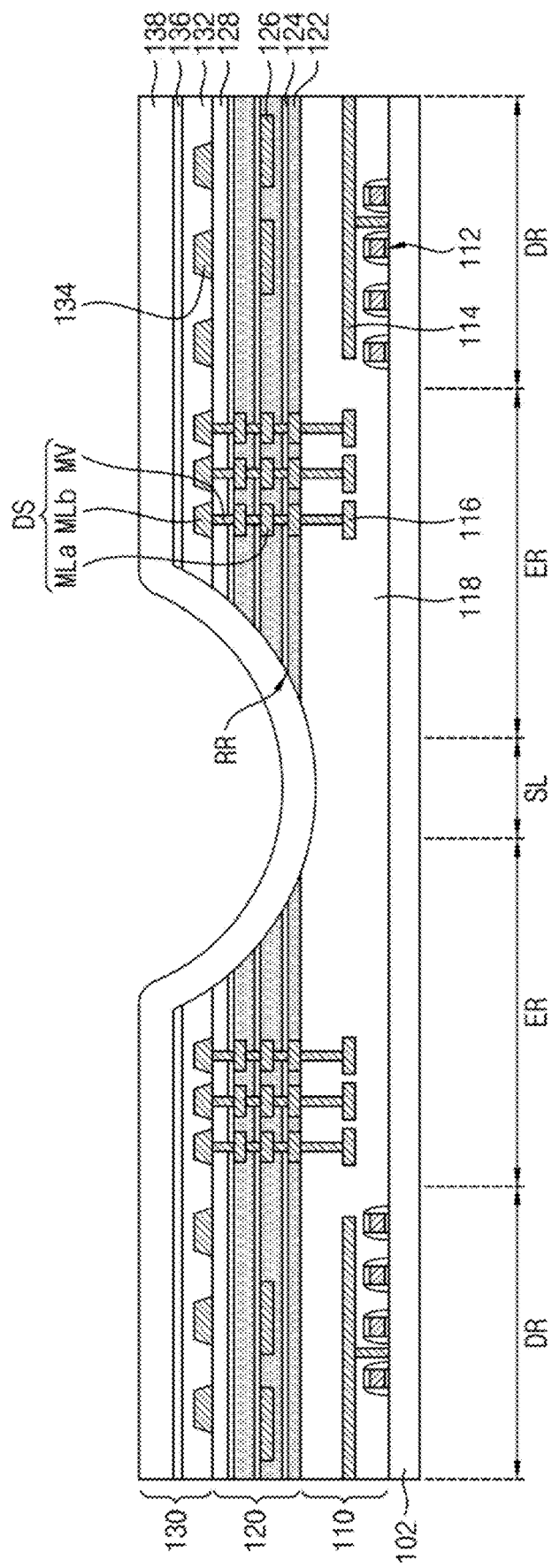

Referring to FIG. 4, a third upper insulating layer 138 may be formed on the resultant structure of FIG. 3. The third upper insulating layer 138 may cover a cut surface or a side surface of the wiring layer 120 such that the wiring layer 120 is not exposed. For example, the third upper insulating layer 138 may cover the lower interlayer insulating layer 118, the wiring layer 120, the first upper insulating layer 132 and the second upper insulating layer 136, and may be conformally formed. When the recessed region RR exposes the lower interlayer insulating layer 118, for example, when the lower end of the recessed region RR is disposed at a lower level than the upper surface of the lower interlayer insulating layer 118, the third upper insulating layer 138 may cover the lower interlayer insulating layer 118. Accordingly, as shown, a first portion of the third upper insulating layer 138 may cover one or more side surfaces of the wiring layer 120 that are exposed by the recessed region RR and a second portion of the third upper insulating layer 138 may cover a portion of an upper surface of the device layer 110 (e.g., upper surface of the lower interlayer insulating layer 118) that is exposed by the recessed region RR. The first upper insulating layer 132, the second upper insulating layer 136 and the third upper insulating layer 138 may constitute an upper insulating layer 130. In some example embodiments, the third upper insulating layer 138 may include silicon oxide. For example, the third upper insulating layer 138 may include tetraethylorthosilicate (TEOS).

Figure 5:
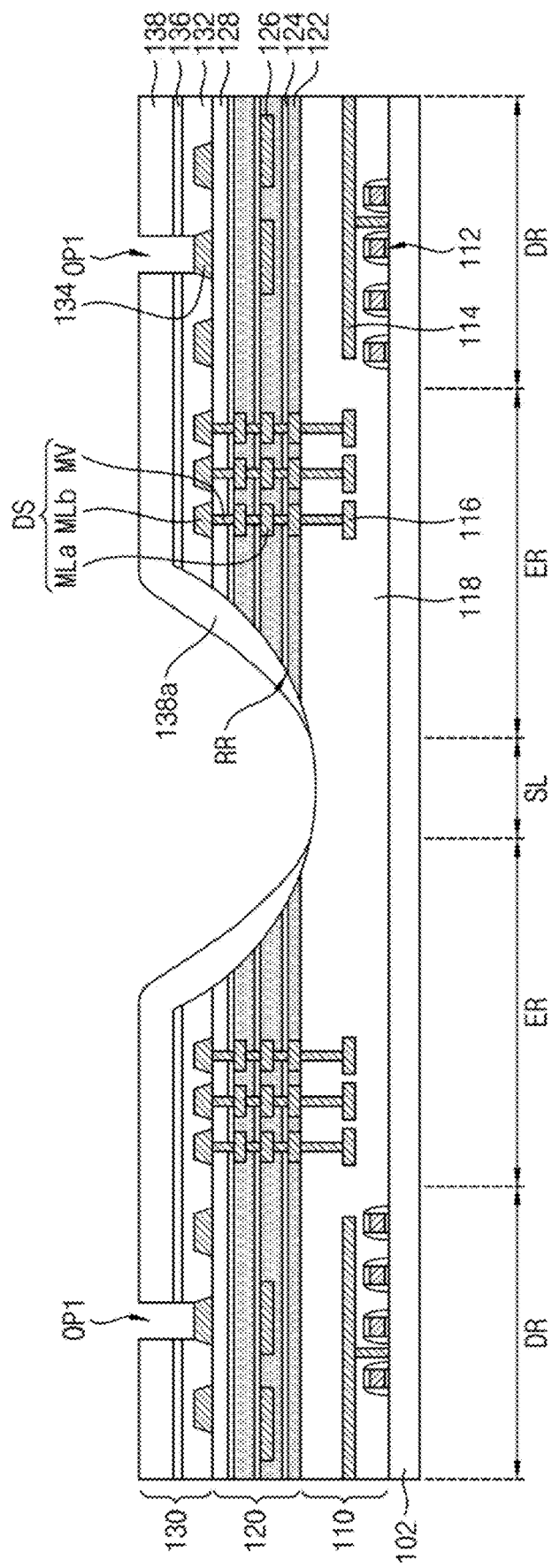

Referring to FIG. 5, the upper insulating layer 130 may be patterned. By this patterning process, openings OP1 may be formed. The openings OP1 may extend through the first upper insulating layer 132, the second upper insulating layer 136 and the third upper insulating layer 138, and may expose the chip pads 134. In some example embodiments, the upper surface of the lower interlayer insulating layer 118 may be exposed by the patterning process, but the wiring layer 120 may not be exposed. The third upper insulating layer 138 may be completely cut in the cutting region SL, and a portion of the third upper insulating layer 138 covering the recessed region RR may be referred to as a cover portion 138a. The cover portion 138a may cover cut surfaces (or side surfaces) of the wiring layer 120, the first upper insulating layer 132 and the second upper insulating layer 136. In some example embodiments, the third upper insulating layer 138 on the lower interlayer insulating layer 118 may be incompletely etched by the patterning process.

Figure 6:
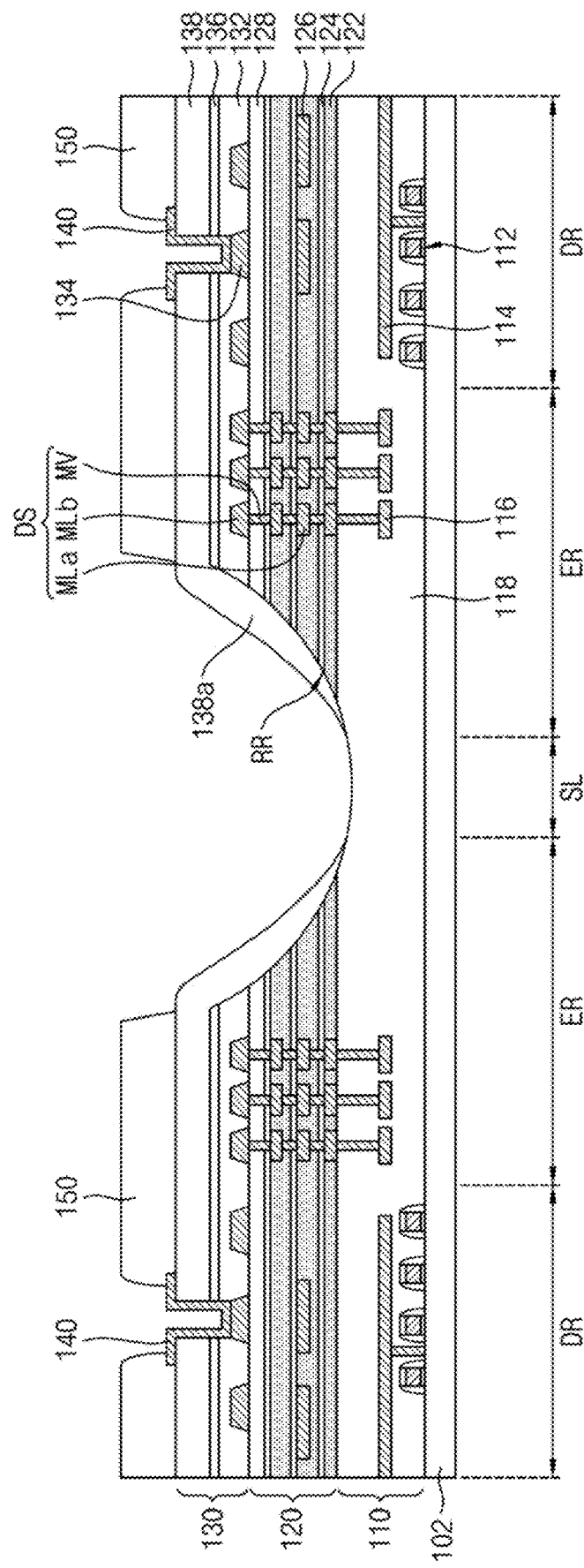
Figure 7:
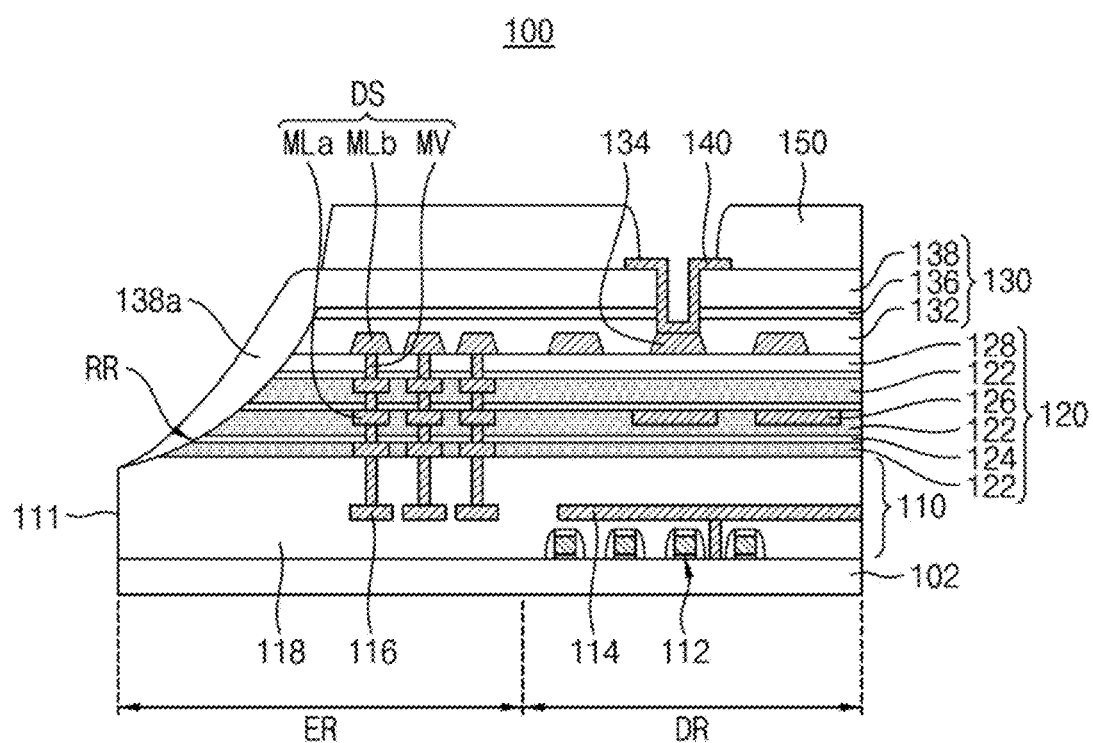
FIG. 7 is a vertical sectional view of a semiconductor chip according to some example embodiments of the inventive concepts.

Referring to FIG. 6, a connection pad 140 and a protective layer 150 may be formed. The connection pad 140 may be formed in the opening OP1, and may contact the chip pad 134. For example, the connection pad 140 may be disposed along a side wall of the opening OP1 and an upper surface of the third upper insulating layer 138. The connection pad 140 may be formed by forming a conductive material on the resultant structure of FIG. 5, and then patterning the conductive material. The connection pad 140 may be formed by a thin film deposition process such as a sputtering process and a plating process. The connection pad 140 may include copper (Cu), aluminum (Al), tungsten (W), nickel (Ni), titanium (Ti), titanium nitride (TiN), tantalum (Ta), tantalum nitride (TaN), gold (Au), or a combination thereof. In addition, the connection pad 140 may further include a barrier material at a bottom surface thereof.

After formation of the connection pad 140, the protective layer 150 may be formed on the upper insulating layer 130. The protective layer 150 may be formed by forming an insulating material by a spin coating process, and then patterning the insulating material. The protective layer 150 may cover the upper surface of the third upper insulating layer 138, and may partially cover the connection pad 140. However, the protective layer 150 may not cover the lower interlayer insulating layer 118 and the cover portion 138a. In some example embodiments, before formation of the protective layer 150, silicon nitride may further be formed. The protective layer 150 may include a polyimide-group material such as photosensitive polyimide (PSPI).

Referring to FIG. 7, a cutting process for cutting the semiconductor substrate 102 along the cutting region SL may be performed. The cutting process may be a sawing process for cutting the semiconductor substrate 102 using a sawing wheel. A semiconductor chip 100 singulated by the cutting process may be formed.

The semiconductor chip 100 may include a device region DR and an edge region ER. Devices 112, a lower wiring 126, a chip pad 134 and a connection pad 140 may be disposed in the device region DR. A dam structure DS may be disposed in the edge region ER. In addition, the semiconductor chip 100 may include (e.g., may at least partially define) a recessed region RR in the edge region ER. The recessed region RR may extend from a side surface 111 of a device layer 110 toward the device region DR. The thickness of a wiring layer 120 exposed by (e.g., at least partially defining) the recessed region RR may gradually increase as the wiring layer 120 extends from the edge region ER toward the device region DR. The horizontal length of each of the wiring layer 120, a first upper insulating layer 132 and a second upper insulating layer 136 may be smaller than the horizontal length of a semiconductor substrate 102. As the wiring layer 120, the first upper insulating layer 132 and the second upper insulating layer 136 extend away from an upper surface of the device layer 110, horizontal lengths thereof may gradually decrease. A third upper insulating layer 138 may include a cover portion 138a covering the recessed region RR. For example, the cover portion 138a may extend from an upper surface of the second upper insulating layer 136 to an upper surface of a lower interlayer insulating layer 118 in a diagonal direction, and may cover side surfaces of the wiring layer 120, the first upper insulating layer 132 and the second upper insulating layer 136 in the edge region ER.

As shown in FIGS. 3 and 4, after the recessed region RR is formed by cutting the wiring layer 120 before execution of the cutting process, the third upper insulating layer 138 is formed to cover the recessed region RR and, as such, the wiring layer 120 of the semiconductor chip 100 may not be exposed. Accordingly, an upper insulating layer 130 may protect the wiring layer 120. As a result, oxidation of the wiring layer 120 may be prevented, and peeling of the wiring layer 120 may be prevented or reduced.

Figure 8:
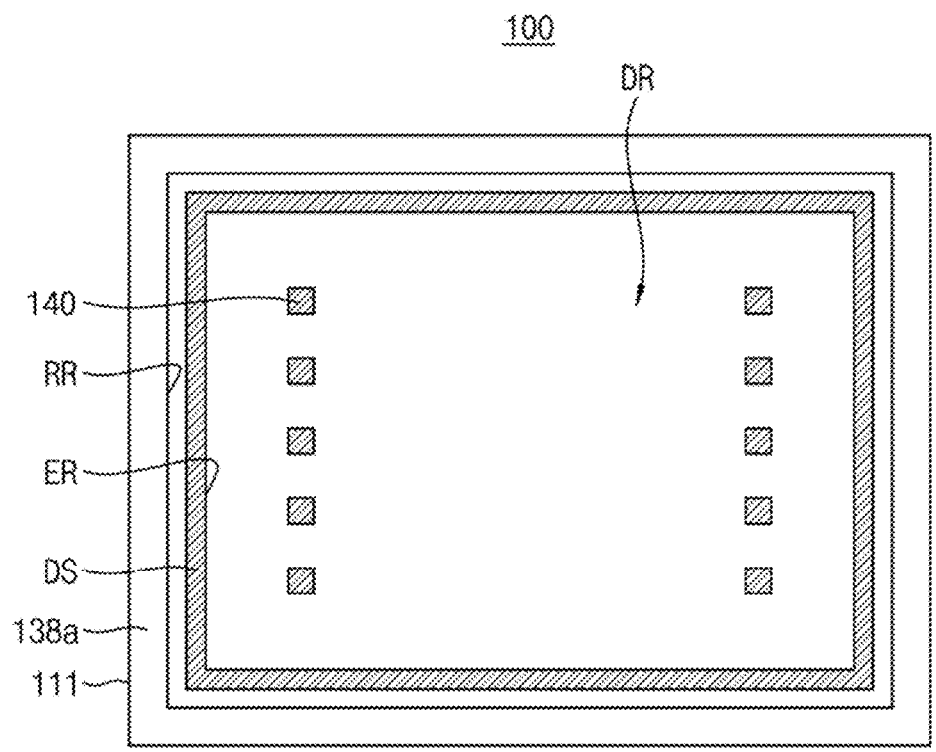
FIG. 8 is a plan view of a semiconductor chip according to some example embodiments of the inventive concepts.

FIG. 8 is a plan view of a semiconductor chip according to some example embodiments of the inventive concepts.

Referring to FIG. 8, a device region DR may be disposed at a central portion of a semiconductor chip 100, and an edge region ER may surround the device region DR and may extend along an edge of the semiconductor chip 100, a semiconductor substrate 102 or a device layer 110. A connection pad 140 may be disposed in the device region DR. A dam structure DS formed in a wiring layer 120 and an upper insulating layer 130 may be disposed in the edge region ER, and may extend in a horizontal direction to surround the device region DR. In plan view, the dam structure DS may have a quadrangular shape or a frame shape, without being limited thereto. A recessed region RR may extend along the edge of the semiconductor chip 100, the semiconductor substrate 102 or the device layer 110. Although the recessed region RR is shown in FIG. 8 as being disposed outside the dam structure DS, the example embodiments of the inventive concepts are not limited thereto. In some example embodiments, the recessed region RR may partially overlap with the dam structure DS. Since the recessed region RR is disposed along the edge of the semiconductor chip 100, and a cover portion 138a of a third upper insulating layer 138 covers the recessed region RR, as shown in FIG. 8, peeling of the wiring layer 120 may be prevented. The cover portion 138a covering the recessed region RR may also extend along the edge of the semiconductor substrate 102 or the device layer 110.

Figure 9:
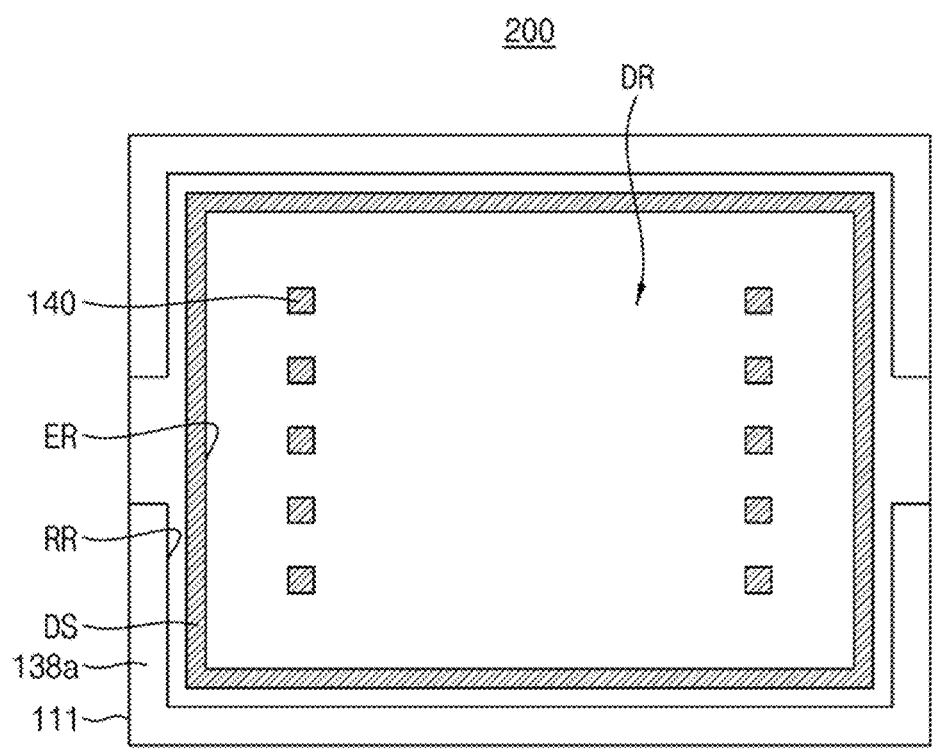
FIG. 9 is a plan view of a semiconductor chip according to some example embodiments of the inventive concepts.

FIG. 9 is a plan view of a semiconductor chip according to some example embodiments of the inventive concepts.

Referring to FIG. 9, a semiconductor chip 200 may include a recessed region RR extending along an edge thereof. In some example embodiments, the recessed region RR may not be formed at a portion of the edge of the semiconductor chip 200, a portion of an edge of a semiconductor substrate 102, or a portion of an edge of a device layer 110. For example, the recessed region RR may be disposed in plural, and the plurality of recessed regions RR may be spaced apart from one another. At the portion where the recessed region RR is not formed, a test pattern and/or an alignment pattern may be disposed. The test pattern may represent a test device and a wiring structure connected thereto which have substantially the same structures as a device, a wiring and a lower wiring 126 in order to evaluate electrical characteristics of the semiconductor chip 200. The alignment pattern may represent a pattern used as an alignment reference in a process of manufacturing the semiconductor chip 200.

FIGS. 10, 11, 12, 13, and 14 are vertical sectional views illustrating in process order of a method of manufacturing a semiconductor chip according to some example embodiments of the inventive concepts. FIG. 15 is a vertical sectional view of a semiconductor chip according to some example embodiments of the inventive concepts.

Figure 10:
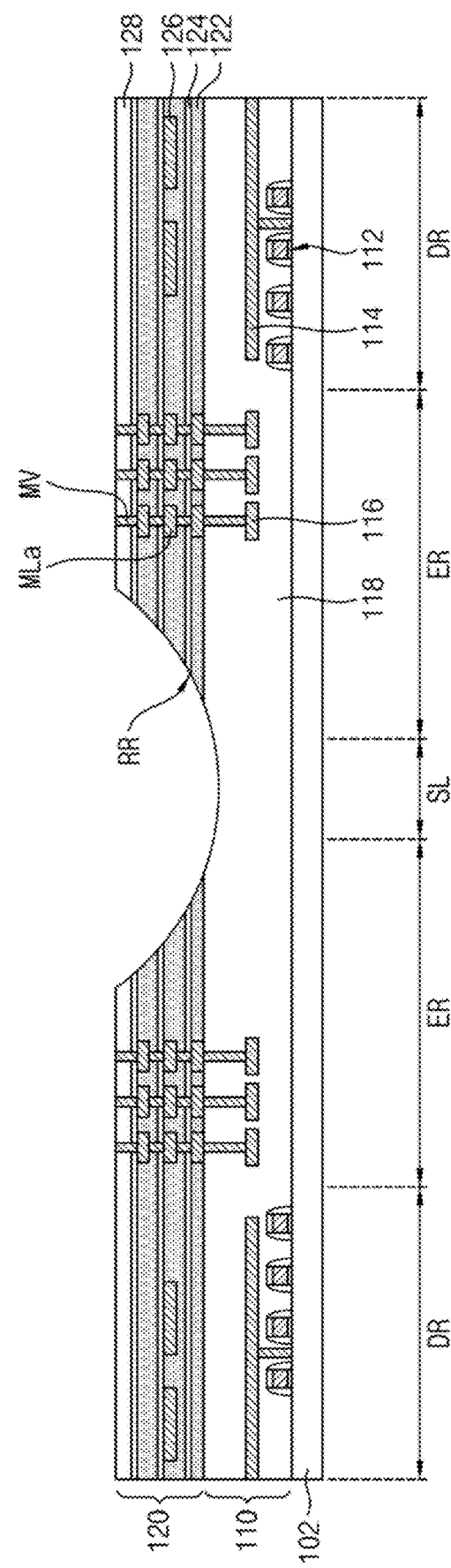
FIGS. 10, 11, 12, 13, and 14 are vertical sectional views illustrating in process order of a method of manufacturing a semiconductor chip according to some example embodiments of the inventive concepts.

Referring to FIG. 10, a semiconductor substrate 102, a device layer 110 and a wiring layer 120 may be formed, as described with reference to FIGS. 1 and 2. The wiring layer 120 may include a first lower insulating layer 122, a second lower insulating layer 124, a lower wiring 126, and an upper interlayer insulating layer 128. The upper interlayer insulating layer 128 may be disposed at an upper portion of the wiring layer 120. In addition, lower metal lines Mla, and metal vias MV interconnecting the lower metal lines Mla may be formed in the wiring layer 120 in an edge region ER. An upper surface of an uppermost one of the metal vias MV may be coplanar with an upper surface of the upper interlayer insulating layer 128.

After formation of the wiring layer 120, a recessed region RR may be formed by an etching process, as described with reference to FIG. 3. In a cutting region SL, the wiring layer 120 may be completely cut, and an upper surface of a lower interlayer insulating layer 118 may be exposed. In some example embodiments, the upper surface of the lower interlayer insulating layer 118 may be partially etched, without being limited thereto. In the edge region ER, the wiring layer 120 may be partially etched. An upper end of the recessed region RR may be disposed at the same level as an upper surface of the wiring layer 120 or the upper surface of the upper interlayer insulating layer 128.

Figure 11:
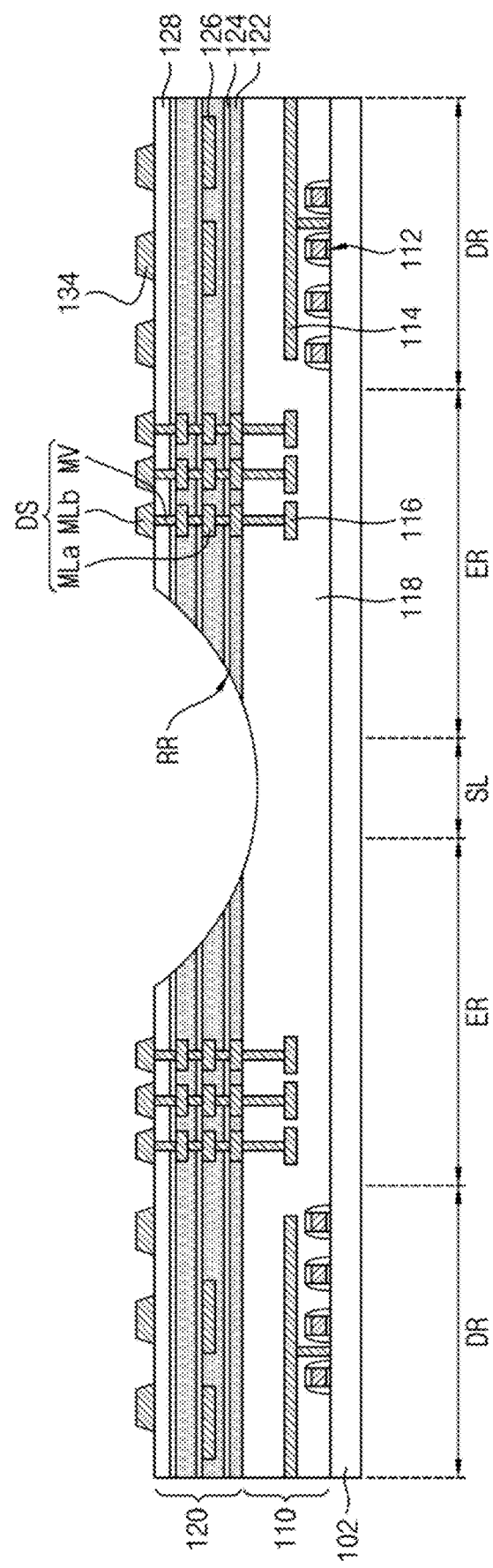

Referring to FIG. 11, after formation of the wiring layer 120, a chip pad 134 may be formed on the upper interlayer insulating layer 128. In addition, a metal pattern may be further formed on the upper interlayer insulating layer 128, together with the chip pad 134. The chip pad 134 may be disposed in a device region DR, and may be electrically connected to the lower wiring 126. From among metal patterns, the metal pattern disposed in the edge region ER and connected to the lower metal line Mla may be referred to as an upper metal line MLb. The upper metal line MLb may be connected to the lower metal line Mla by the metal via MV. The lower metal lines Mla, the upper metal line MLb, and the metal vias MV may constitute a dam structure DS.

Figure 12:
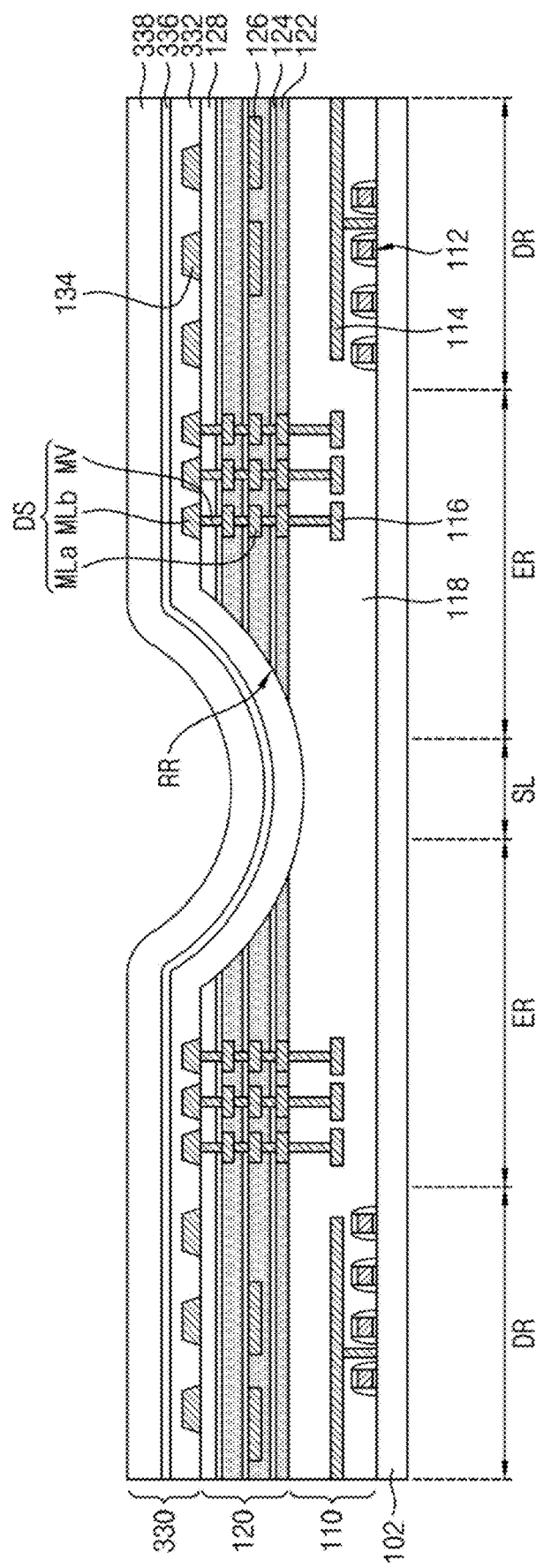

Referring to FIG. 12, an upper insulating layer 330 may be deposited on the wiring layer 120. The upper insulating layer 330 may include a first upper insulating layer 332, a second upper insulating layer 336 and a third upper insulating layer 338 which are sequentially stacked. The first upper insulating layer 332 may cover the chip pad 134 and the upper metal line MLb. The first upper insulating layer 332, the second upper insulating layer 336 and the third upper insulating layer 338 may be conformally deposited in the recessed region RR, and may be downwardly convex in the recessed region RR.

Figure 13:
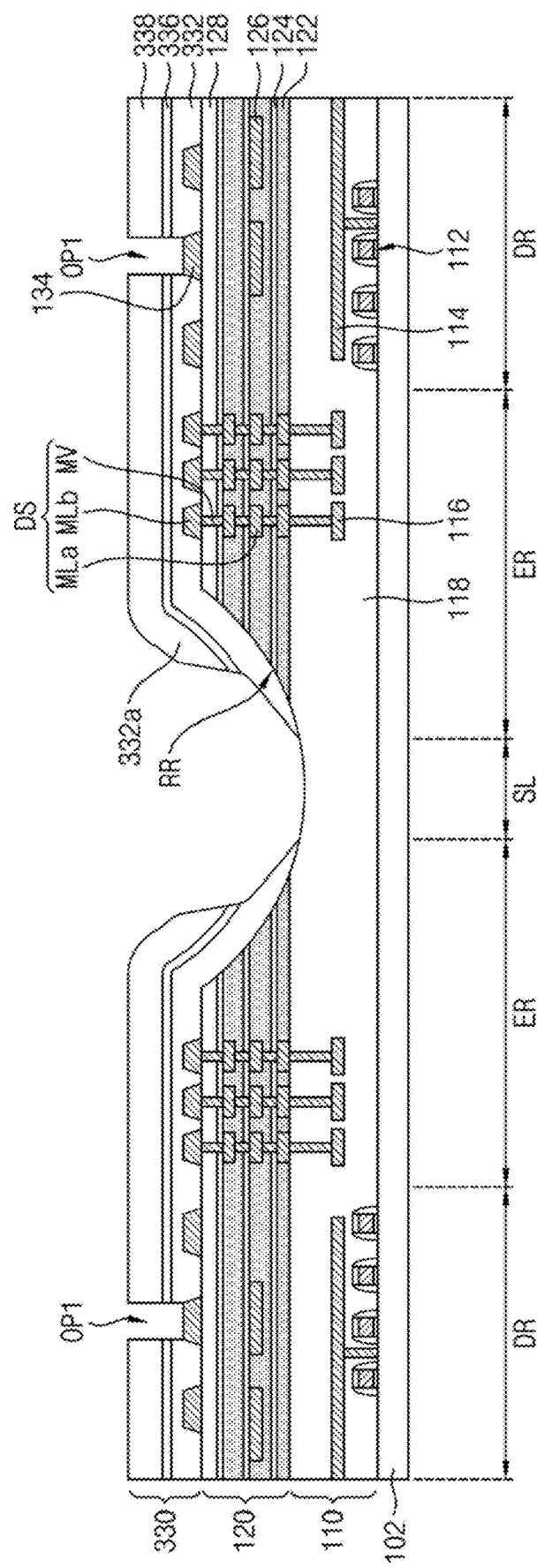

Referring to FIG. 13, the upper insulating layer 330 may be patterned, as described with reference to FIG. 5. Openings OP1 may be formed by the patterning process. The openings OP1 may extend through the first upper insulating layer 332, the second upper insulating layer 336 and the third upper insulating layer 338, and may expose chip pads 134. In some example embodiments, the upper surface of the lower interlayer insulating layer 118 may be exposed by the patterning process, but the wiring layer 120 may not be exposed. The first upper insulating layer 332, the second upper insulating layer 336 and the third upper insulating layer 338 may be completely cut in the cutting region SL. A portion of the first upper insulating layer 332 covering the recessed region RR may be referred to as a first upper cover portion 332a, and a portion of the second upper insulating layer 336 covering the first upper cover portion 332a may be referred to as a second upper cover portion 336a, and a portion of the third upper insulating layer 338 covering the second upper cover portion 336a may be referred to as a third upper cover portion 338a. The first cover portion 332a may cover a cut surface (or a side surface) of the wiring layer 120.

Figure 14:
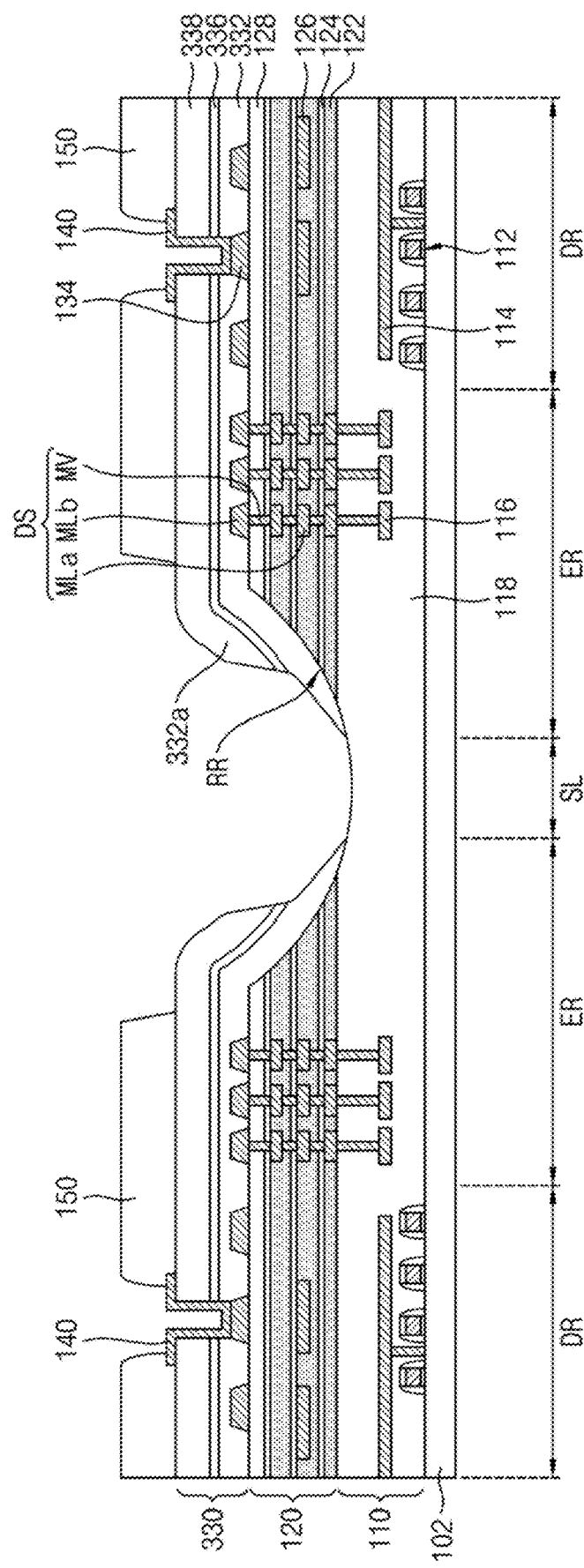
Figure 15:
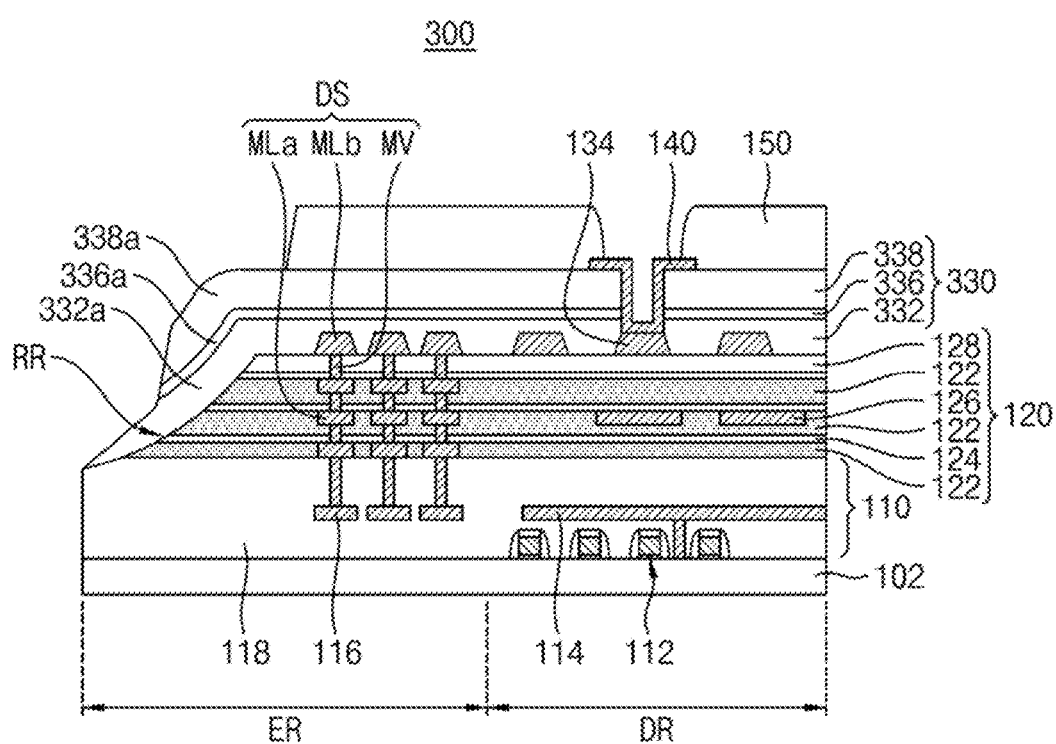
FIG. 15 is a vertical sectional view of a semiconductor chip according to some example embodiments of the inventive concepts.

Referring to FIG. 14, a connection pad 140 and a protective layer 150 may be formed, as described with reference to FIG. 6. The protective layer 150 may cover an upper surface of the third upper insulating layer 338, and may partially cover the connection pad 140.

Referring to FIG. 15, a cutting process for cutting the semiconductor substrate 102 along the cutting region SL may be performed, as described with reference to FIG. 7. A semiconductor chip 300 singulated by the cutting process may be formed.

The semiconductor chip 300 may include a wiring layer 120 on a device layer 110, and an upper insulating layer 330 on the wiring layer 120. In addition, the semiconductor chip 300 may include a recessed region RR in an edge region ER. For example, the wiring layer 120 may have a recessed shape in the edge region ER.

A first upper cover portion 332a may cover the recessed region RR, and may contact a side surface of the wiring layer 120. A second upper cover portion 336a may cover the first upper cover portion 332a. In some example embodiments, an upper surface of the first upper cover portion 332a may be partially exposed, and may be incompletely covered by the second upper cover portion 336a. A third upper cover portion 338a may cover the second upper cover portion 336a.

FIGS. 16, 17, 18, 19, 20, and 21 are vertical sectional views illustrating in process order of a method of manufacturing a semiconductor chip according to some example embodiments of the inventive concepts. FIG. 22 is a vertical sectional view of a semiconductor chip according to some example embodiments of the inventive concepts.

Figure 16:
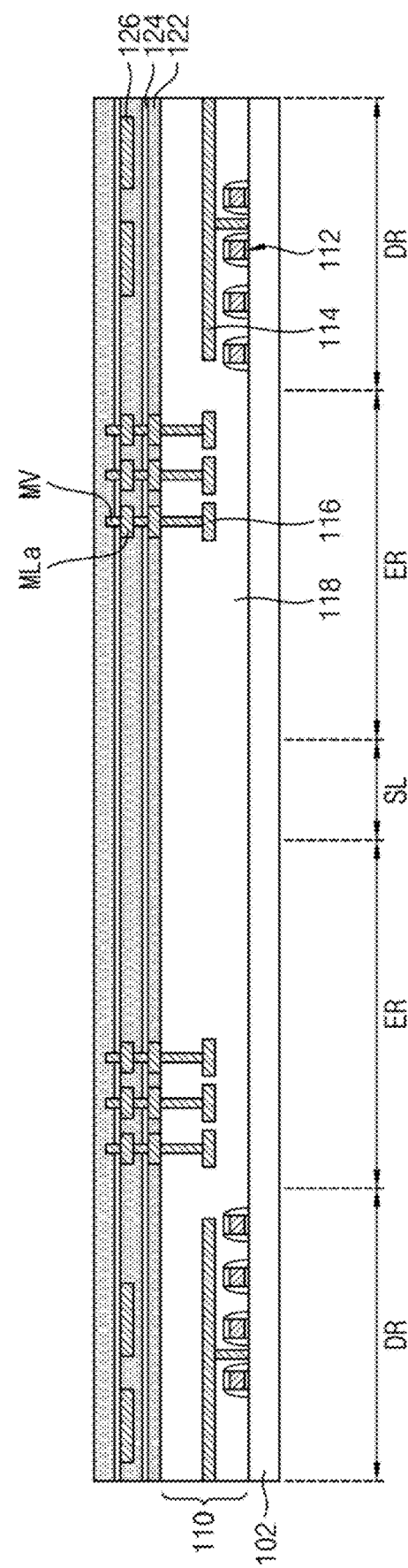
FIGS. 16, 17, 18, 19, 20, and 21 are vertical sectional views illustrating in process order of a method of manufacturing a semiconductor chip according to some example embodiments of the inventive concepts.

Referring to FIG. 16, a semiconductor substrate 102, a device layer 110, a first lower insulating layer 122, a second lower insulating layer 124 and a wiring 126 may be formed, as described with reference to FIGS. 1 and 2. The first lower insulating layer 122 may be stacked alternately with the second lower insulating layer 124, and the wiring 126 may be formed in at least one of first lower insulating layers 122. In addition, lower metal lines Mla, and metal vias MV interconnecting the lower metal lines Mla may be formed. The lower metal lines Mla may be formed in the form of two layers, and the metal vias MV may be formed on the lower metal lines Mla. The first lower insulating layers 122 may cover the metal vias MV.

Figure 17:
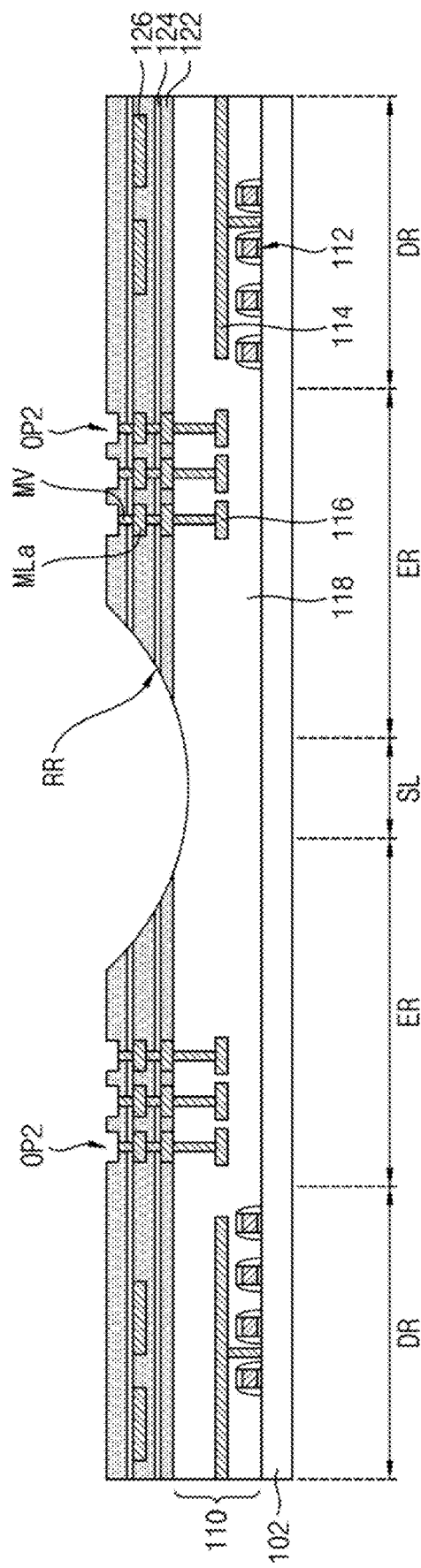

Referring to FIG. 17, the first lower insulating layers 122 and second lower insulating layers 124 may be etched by an etching process, thereby forming a recessed region RR. In addition, an uppermost one of the first lower insulating layers 122 may be etched, thereby forming an opening OP2. In some example embodiments, openings OP2 may be formed simultaneously with the recessed region RR. For example, a hard mask may be formed on the resultant structure of FIG. 16, and a photoresist may be formed on the hard mask. The photoresist may be patterned by an exposure process. The exposure process may be performed by irradiating the photoresist with electron beams or light. In some example embodiments, amounts of electron beams or light irradiating a portion of the photoresist corresponding to a cutting area SL and a portion of the photoresist corresponding to an edge region ER may be different. For example, the exposure process may be performed such that the cutting region SL is irradiated with a greater amount of electron beams or light. The photoresist may be etched by the exposure process, thereby forming an etch pattern. Etched amounts of the photoresist in the cutting region SL and the edge region ER may be different. For example, the etch pattern in the edge region ER may be narrower and/or shallower than the etch pattern in the cutting region SL. Thereafter, the hard mask may be etched using the photoresist as an etch mask, and the opening OP2 and the recessed region RR may be formed by an etching process using the etched hard mask as an etch mask. Accordingly, the recessed region RR may be formed to be deeper and wider than the opening OP2. For example, in the cutting region SL, the recessed region RR may completely extend through the first lower insulating layers 122 and the second lower insulating layers 124, and may expose a lower interlayer insulating layer 118. The opening OP2 may partially extend through the first lower insulating layer 122, thereby exposing the metal via MV. An upper end of the recessed region RR may be disposed at the same level as an upper surface of the uppermost one of the first lower insulating layers 122.

In some example embodiments, a plurality of etching processes may be performed for the resultant structure of FIG. 16, and the opening OP2 and the recessed region RR may be formed by different etching processes, respectively.

Figure 18:
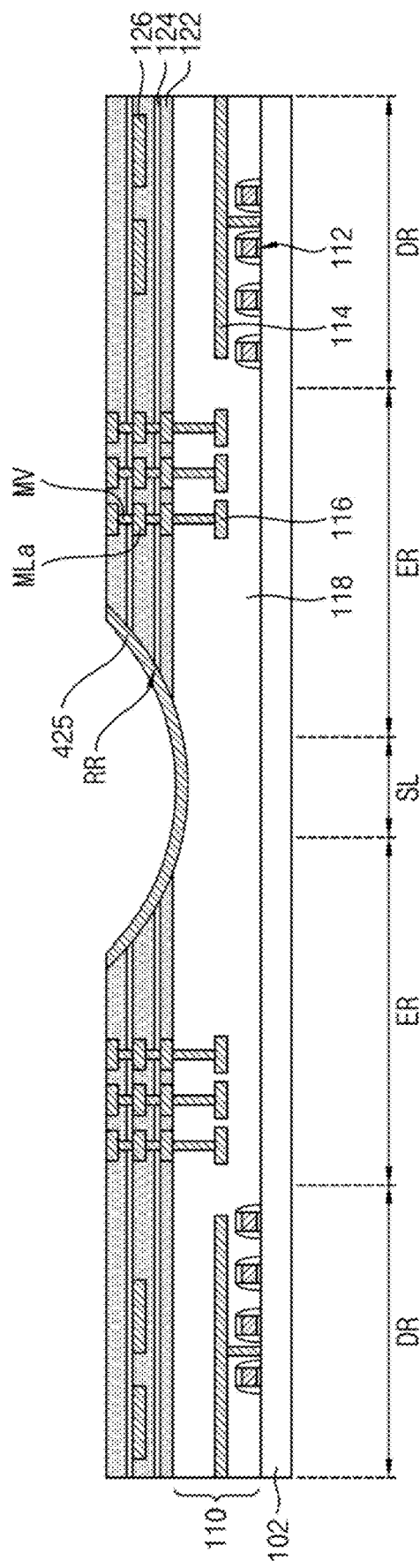

Referring to FIG. 18, a lower metal line Mla filling the opening OP2 and a cover structure 425 covering the recessed region RR may be formed. The lower metal line Mla and the cover structure 425 may be formed by forming a conductive material on the resultant structure of FIG. 17, and then patterning the conductive material. The cover structure 425 may be conformally formed along an inner wall of the recessed region RR, and may be rounded. An upper end of the cover structure 425 may be disposed at the same level as the upper surface of the uppermost one of the first lower insulating layers 122. The cover structure 425 may include the same material as the lower metal line Mla. For example, the cover structure 425 and the lower metal line Mla may include copper (Cu).

Figure 19:
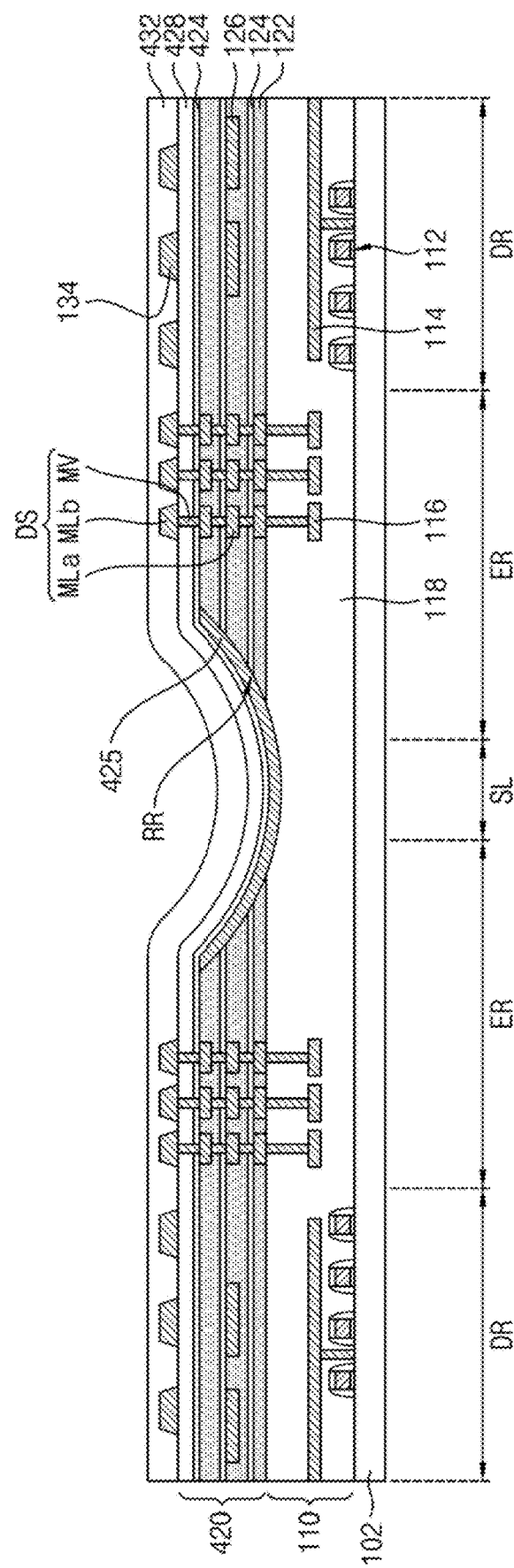

Referring to FIG. 19, a third lower insulating layer 424, an upper interlayer insulating layer 428, a chip pad 134, an upper metal line MLb, and a first upper insulating layer 432 may be formed on the resultant structure of FIG. 18. The first lower insulating layer 122, the second lower insulating layer 124, the wiring 126, the third lower insulating layer 424, and the upper interlayer insulating layer 428 may constitute a wiring layer 420. The third lower insulating layer 424 may represent an uppermost one of the second lower insulating layers 124. The third lower insulating layer 424 and the upper interlayer insulating layer 428 may be conformally formed on the first lower insulating layer 122 and the cover structure 425. The chip pad 134 and the upper metal line MLb may be formed on the upper interlayer insulating layer 428. In addition, a metal via MV interconnecting the upper metal line MLb and the lower metal line Mla may be further formed. The first upper insulating layer 432 may be formed to cover the chip pad 134 and the upper metal line MLb.

Figure 20:
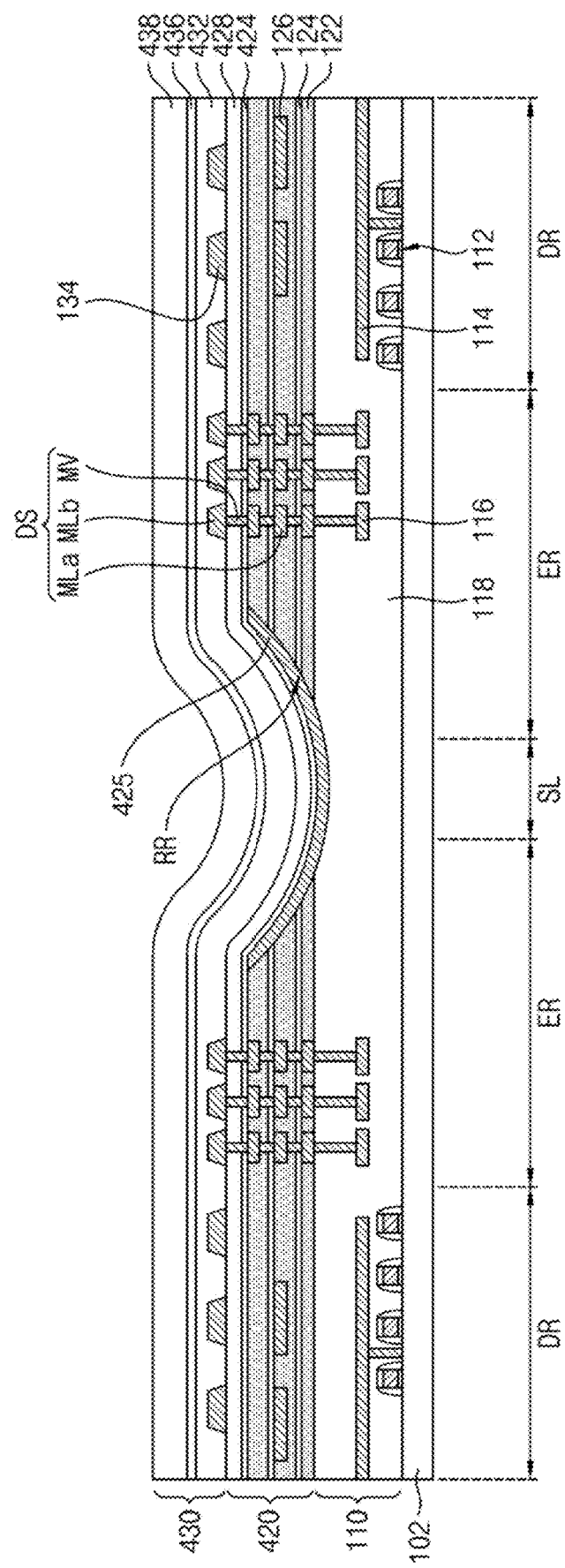

Referring to FIG. 20, a second upper insulating layer 436 and a third upper insulating layer 438 may be deposited on the first upper insulating layer 432. The first upper insulating layer 432, the second upper insulating layer 436 and the third upper insulating layer 438 may constitute an upper insulating layer 430. The cover structure 425, the third lower insulating layer 424, the upper interlayer insulating layer 428, and the upper insulating layer 430 may be downwardly convex in the recessed region RR.

Figure 21:
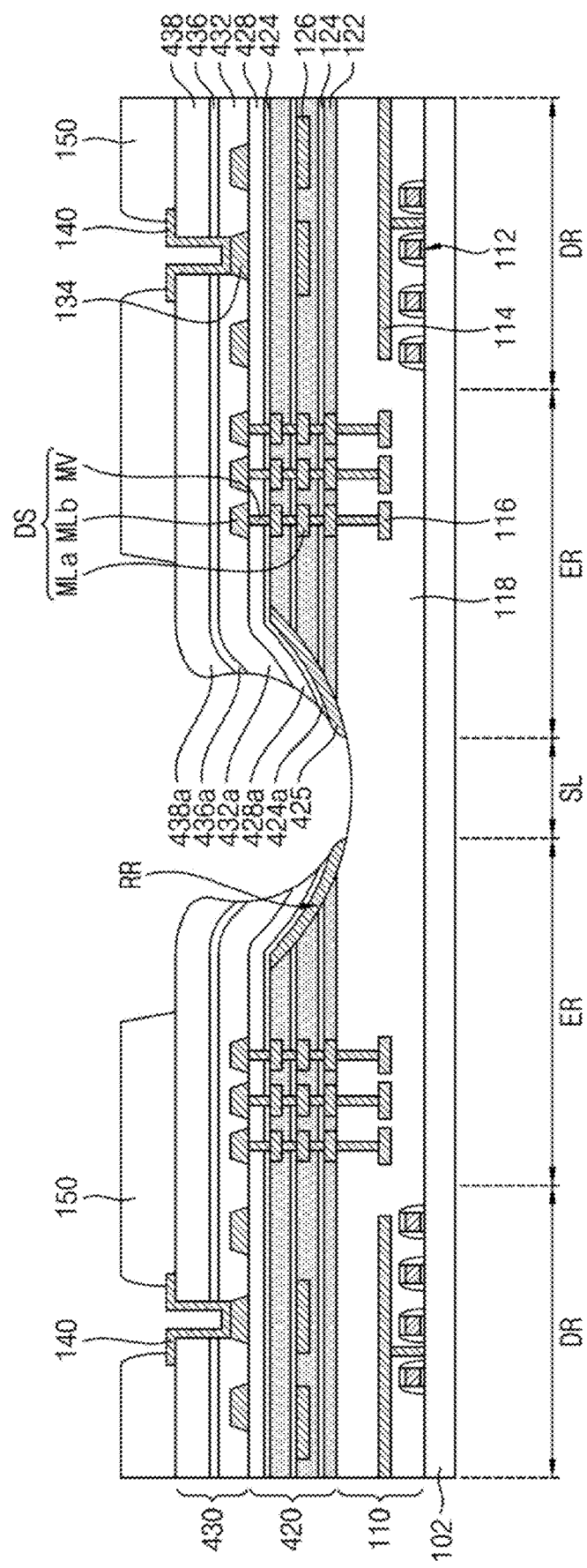
Figure 22:
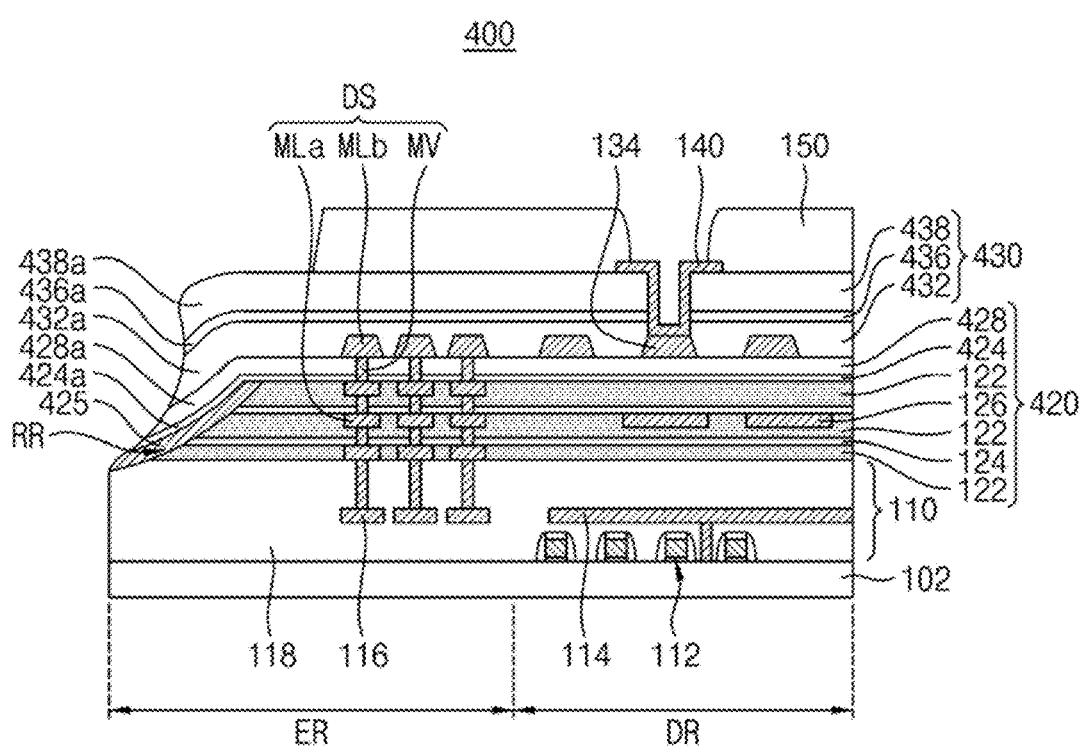
FIG. 22 is a vertical sectional view of a semiconductor chip according to some example embodiments of the inventive concepts.

Referring to FIG. 21, the cover structure 425, the third lower insulating layer 424, the upper interlayer insulating layer 428, and the upper insulating layer 430 may be patterned, as described with reference to FIG. 5. The cover structure 425, the third lower insulating layer 424, the upper interlayer insulating layer 428, and the upper insulating layer 430 may be completely cut in the cutting region SL. A portion of the third lower insulating layer 424 covering the cover structure 425 may be referred to as a cover portion 424a, and a portion of the upper interlayer insulating layer 428 covering the cover portion 424a of the third lower insulating layer 424 may be referred to as a cover portion 428a. A portion of the first upper insulating layer 432 covering the cover portion 428a of the upper interlayer insulating layer 428 may be referred to as a first upper cover portion 432a, a portion of the second upper insulating layer 436 covering the first upper cover portion 432a may be referred to as a second upper cover portion 436a, and a portion of the third upper insulating layer 438 covering the second upper cover portion 436a may be referred to as a third upper cover portion 438a. Subsequently, a connection pad 140 connected to the chip pad 134, and a protective layer 150 disposed on the upper insulating layer 430 while partially covering the connection pad 140 may be formed.

Referring to FIG. 22, a cutting process for cutting the semiconductor substrate 102 along the cutting region SL may be performed, as described with reference to FIG. 7. A semiconductor chip 400 singulated by the cutting process may be formed.

The semiconductor chip 400 may include a wiring layer 420 on a device layer 110, and an upper insulating layer 430 on the wiring layer 420. In addition, the semiconductor chip 400 may include a cover structure 425 covering a recessed region RR. Cover portions 424a, 428a, 432a, 436a and 438a may have a structure in which the cover portions 424a, 428a, 432a, 436a and 438a are sequentially stacked on the cover structure 425. Since the cover structure 425 covers a side surface of the wiring layer 420 exposed by the recessed region RR, the cover structure 425 may prevent oxidation of the wiring layer 420, and may prevent or reduce peeling of the wiring layer 420.

FIGS. 23, 24, 25, 26, and 27 are vertical sectional views illustrating in process order of a method of manufacturing a semiconductor chip according to some example embodiments of the inventive concepts. FIG. 28 is a vertical sectional view of a semiconductor chip according to some example embodiments of the inventive concepts.

Figure 23:
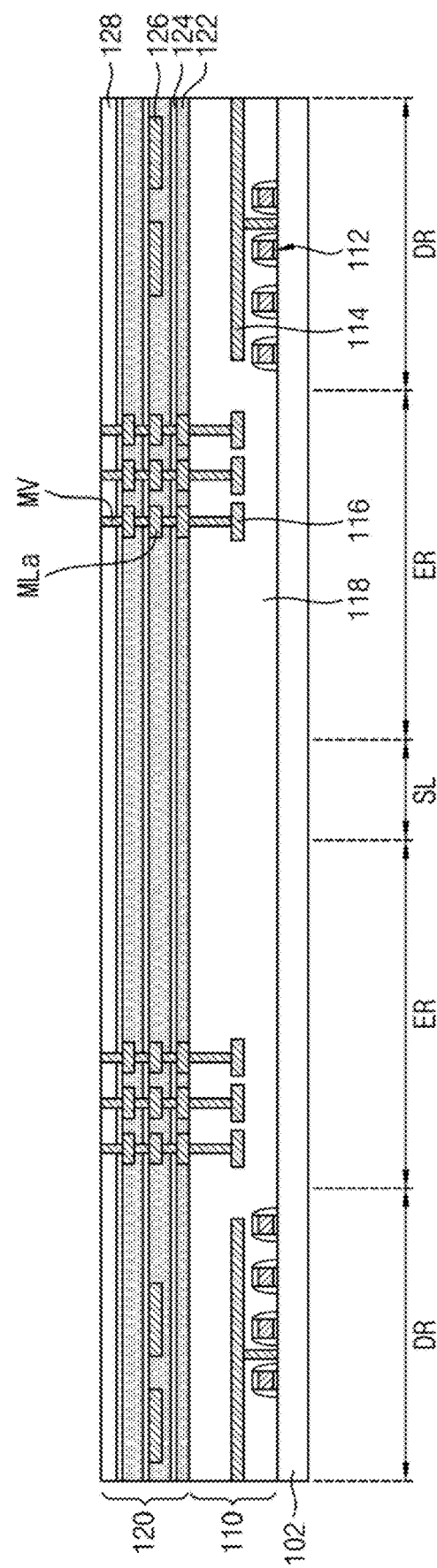
FIGS. 23, 24, 25, 26, and 27 are vertical sectional views illustrating in process order of a method of manufacturing a semiconductor chip according to some example embodiments of the inventive concepts.

Referring to FIG. 23, a semiconductor substrate 102, a device layer 110 and a wiring layer 120 may be formed. A first lower insulating layer 122 may be stacked alternately with a second lower insulating layer 124, and a wiring 126 may be formed in at least one of first lower insulating layers 122. An upper interlayer insulating layer 128 may be disposed at an upper portion of the wiring layer 120. In addition, lower metal lines Mla, and metal vias MV interconnecting the lower metal lines Mla may be formed. The lower metal lines Mla may be formed in the form of three layers, and the metal vias MV may be formed on the lower metal lines Mla. An upper surface of an uppermost one of the metal vias MV may be coplanar with an upper surface of the upper interlayer insulating layer 128.

Figure 24:
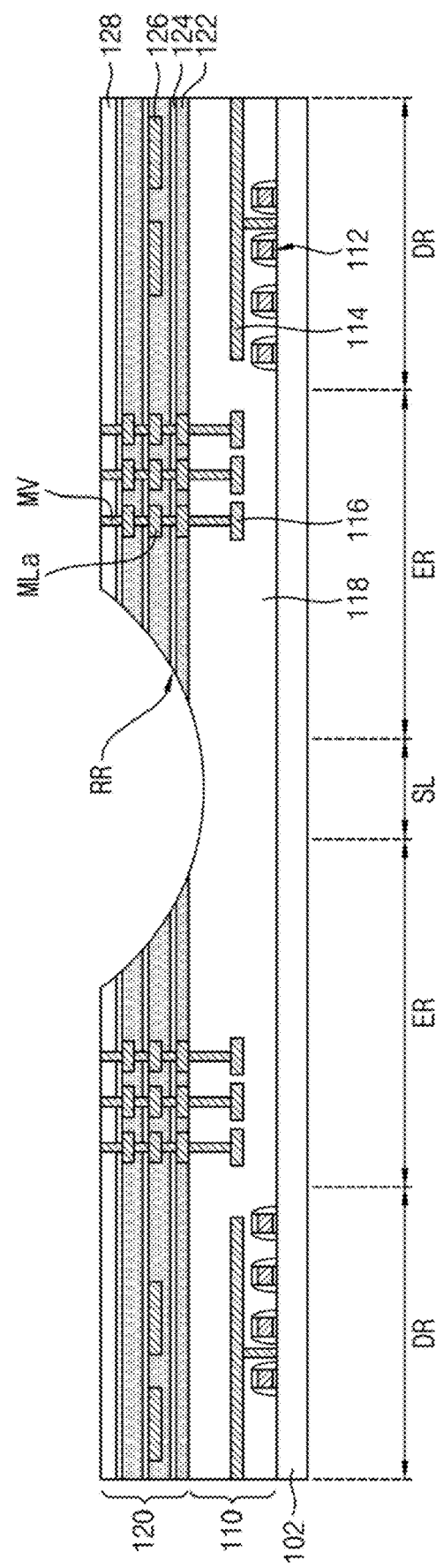

Referring to FIG. 24, a recessed region RR may be formed by an etching process, as described with reference to FIG. 3. In a cutting region SL, the wiring layer 120 may be completely cut, and an upper surface of a lower interlayer insulating layer 118 may be exposed. An upper end of the recessed region RR may be disposed at the same level as an upper surface of the wiring layer 120 or an upper surface of the upper interlayer insulating layer 128. In some example embodiments, the upper surface of the lower interlayer insulating layer 118 may be partially etched, without being limited thereto. The wiring layer 120 may be partially etched in an edge region ER.

Figure 25:
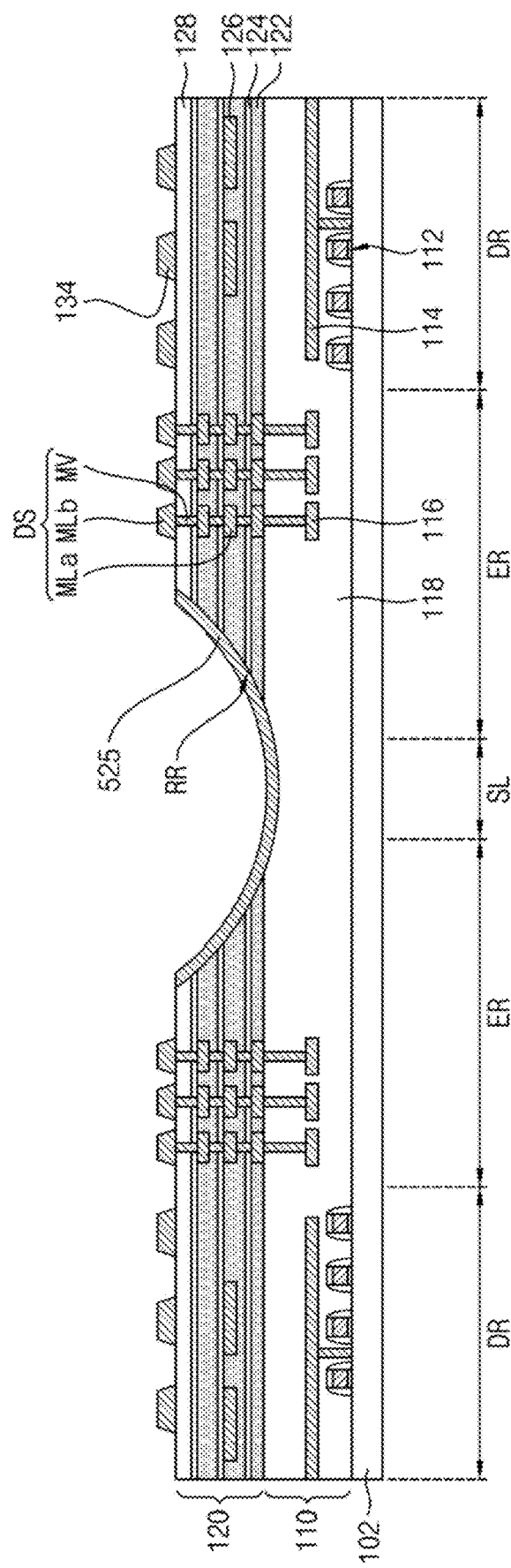

Referring to FIG. 25, a chip pad 134, an upper metal line MLb, and a cover structure 525 may be formed. The chip pad 134, the upper metal line MLb, and the cover structure 525 may be formed by forming a conductive material on the resultant structure of FIG. 24, and then patterning the conductive material. The cover structure 525 may be conformally formed along an inner wall of the recessed region RR, and may be rounded. For example, the cover structure 525 may cover a side surface (or a cut surface) of the wiring layer 120. An upper end of the cover structure 525 may be disposed at the same level as the upper surface of the wiring layer 120. The cover structure 525 may include the same material as the chip pad 134 and the upper metal line MLb. For example, the cover structure 525, the chip pad 134, and the upper metal line MLb may include aluminum (Al).

Figure 26:
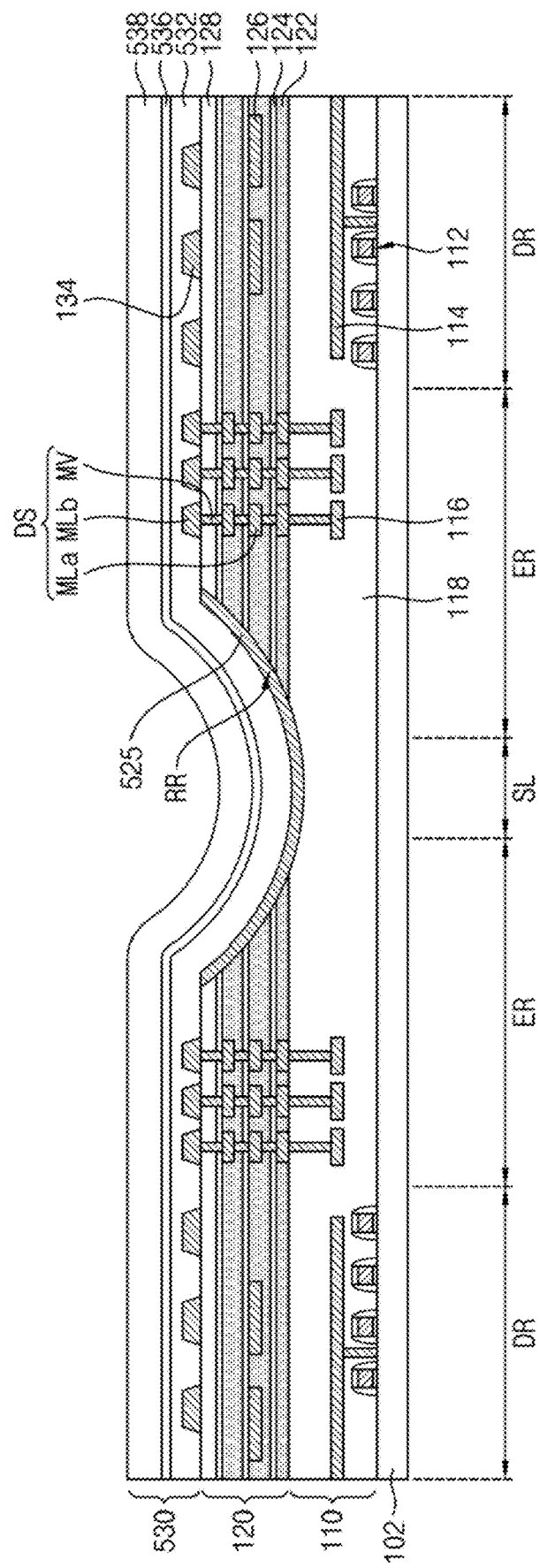

Referring to FIG. 26, a first upper insulating layer 532, a second upper insulating layer 536, and a third upper insulating layer 538 may be sequentially formed on the resultant structure of FIG. 25. The first upper insulating layer 532, the second upper insulating layer 536, and the third upper insulating layer 538 may constitute an upper insulating layer 530. The cover structure 525 and the upper insulating layer 530 may be downwardly convex in the recessed region RR.

Figure 27:
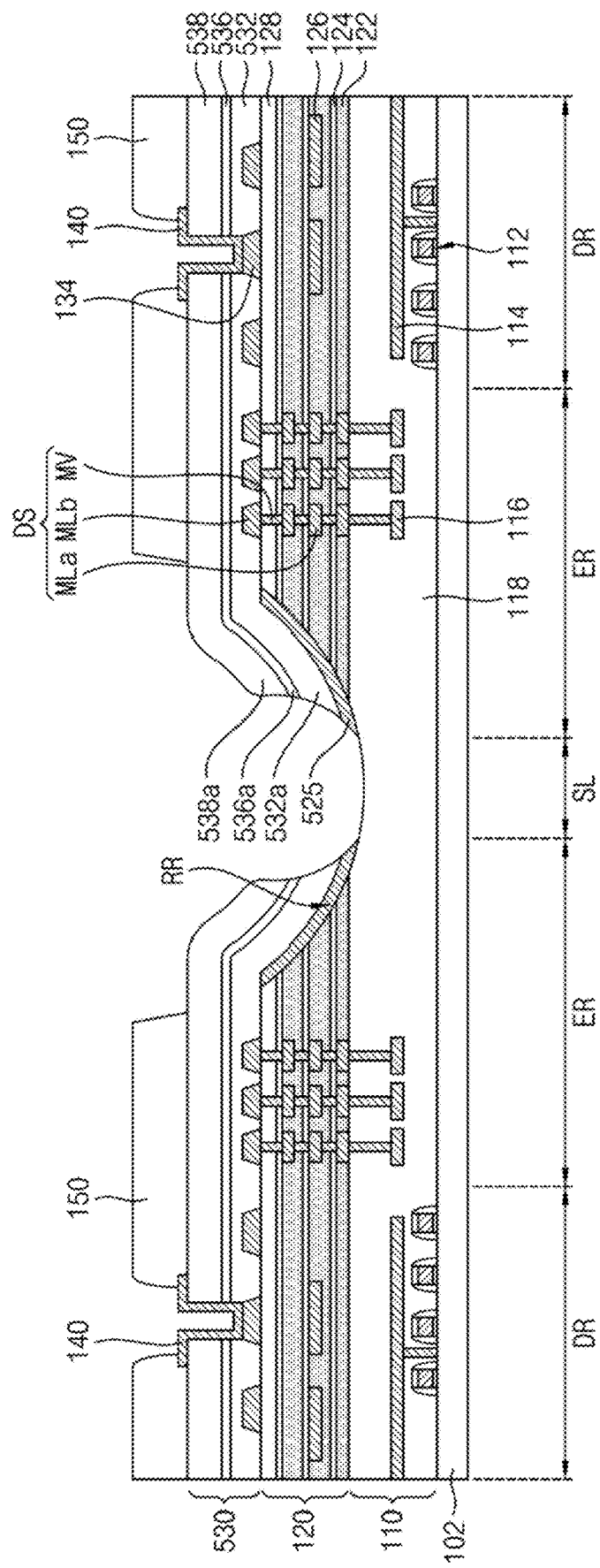
Figure 28:
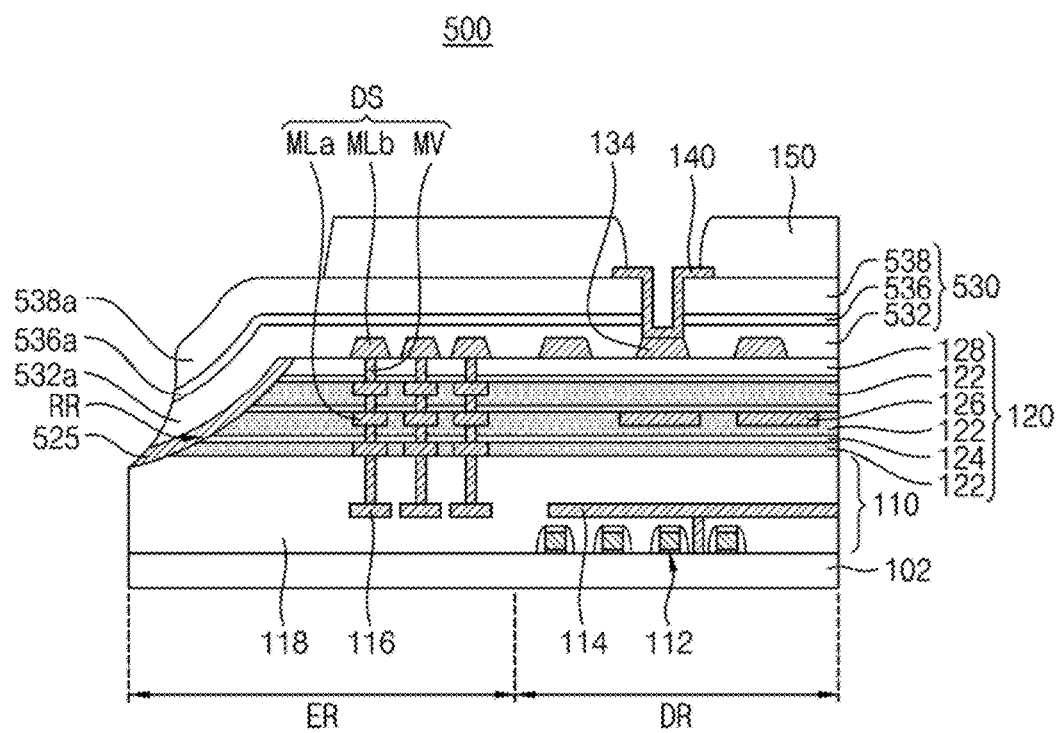
FIG. 28 is a vertical sectional view of a semiconductor chip according to some example embodiments of the inventive concepts.

Referring to FIG. 27, the cover structure 525 and the upper insulating layer 530 may be patterned, as described with reference to FIG. 5. The cover structure 525 and the upper insulating layer 530 may be completely cut in the cutting region SL. In some example embodiments, the cover structure 525 may be incompletely cut. A portion of the first upper insulating layer 532 covering the cover structure 525 may be referred to as a first upper cover portion 532a, a portion of the second upper insulating layer 536 covering the first upper cover portion 532a may be referred to as a second upper cover portion 536a, and a portion of the third upper insulating layer 538 covering the second upper cover portion 536a may be referred to as a third upper cover portion 538a. Subsequently, a connection pad 140 connected to the chip pad 134, and a protective layer 150 disposed on the upper insulating layer 530 while partially covering the connection pad 140 may be formed.

Referring to FIG. 28, a cutting process for cutting the semiconductor substrate 102 along the cutting region SL may be performed, as described with reference to FIG. 7. A semiconductor chip 500 singulated by the cutting process may be formed.

The semiconductor chip 500 may include a wiring layer 120 on a device layer 110, and an upper insulating layer 530 on the wiring layer 120. In addition, the semiconductor chip 500 may include a cover structure 525 covering a recessed region RR. Cover portions 532a, 536a and 538a may have a structure in which the cover portions 532a, 536a and 538a are sequentially stacked on the cover structure 525. Although an upper surface of the cover structure 525 is shown as being partially exposed, the example embodiments of the inventive concepts are not limited thereto. In some example embodiments, the cover structure 525 may be completely covered by a first upper cover portion, that is, the cover portion 532a.

Figure 29:
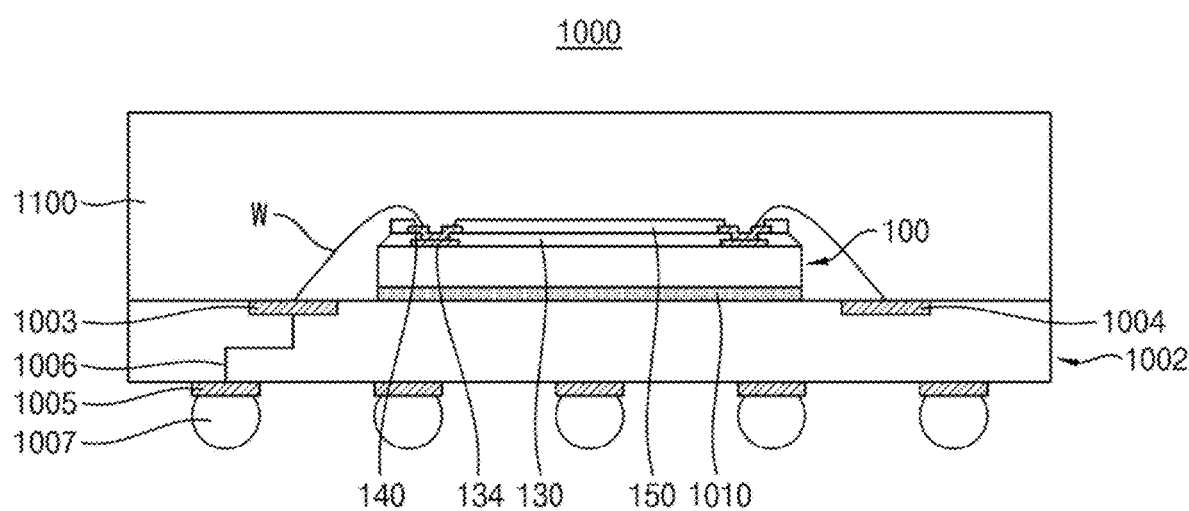
FIG. 29 is a vertical cross-sectional view of a semiconductor package according to some example embodiments of the inventive concepts.

FIG. 29 is a vertical cross-sectional view of a semiconductor package according to some example embodiments of the inventive concepts.

Referring to FIG. 29, a semiconductor package 1000 may include a semiconductor chip 100, a package substrate 1002, an adhesive member 1010, and an encapsulator 1100.

The package substrate 1002 may include upper pads 1003 and 1004, lower pads 1005, an inner wiring 1006, and an outer connection terminal 1007. In some example embodiments, the package substrate 1002 may be a printed circuit board, and may include an insulating material such as a phenolic resin, an epoxy resin, a prepreg, or the like. In some example embodiments, the package substrate 1002 may be a redistribution layer in which an insulating material and a conductive material are stacked. The upper pads 1003 and 1004 and the lower pads 1005 may be formed by forming a metal layer on a base of the package substrate 1002, and then patterning the metal layer. Although not shown, a solder resist layer may be disposed at an upper surface and a bottom surface of the package substrate 1002, and may partially cover the upper pads 1003 and 1004 and the lower pads 1005.

The semiconductor package 1000 may further include a bonding wire W connecting the upper pads 1003 and 1004 to the semiconductor chip 100. The upper pads 1003 and 1004 may be disposed at the upper surface of the package substrate 1002, and may be electrically connected to the semiconductor chip 100. The lower pads 1005 may be disposed at the bottom surface of the package substrate 1002, and each of the upper pads 1003 may be electrically connected to the lower pad 1005 corresponding thereto by the inner wiring 1006. The outer connection terminals 1007 may be disposed under the lower pads 1005.

The lower pad 1005 and the upper pads 1003 and 1004 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). The inner wiring 1006 may include copper (Cu), aluminum (Al), tungsten (W), nickel (Ni), titanium (Ti), titanium nitride (TiN), tantalum (Ta), tantalum nitride (TaN), gold (Au), or a combination thereof. The outer connection terminal 1007 may be a solder bump.

The semiconductor chip 100 may be mounted on the package substrate 1002. The semiconductor chip 100 may include a volatile memory chip such as DRAM or a non-volatile memory chip such as RRAM and flash memory. The semiconductor chip 100 may be mounted on the package substrate 1002 via wire bonding.

The semiconductor chip 100 may include an upper insulating layer 130, a chip pad 134, a protective layer 150 and a connection pad 140 which may be identical or similar to constituent elements of the semiconductor chip 100 shown in FIG. 7. The upper insulating layer 130 may be disposed at an upper portion of the semiconductor chip 100, and the protective layer 150 may be disposed on the upper insulating layer 130, and may protect the upper insulating layer 130 from external physical impact. The chip pad 134 may be buried in the upper insulating layer 130.

The chip pad 134 may include, for example, a ground pad, a power pad, an AC pad, a data pad, and a DC pad. The ground pad may be a pad for providing a reference potential for circuit operation of the semiconductor chip. The power pad may be a pad for supplying power for circuit operation. The AC pad may be a pad for supplying AC power to the semiconductor chip or receiving a signal for execution of an AC test. The data pad may be a pad for input/output of a logic signal or data. The DC pad may be a pad for measuring a potential level of a particular position of the semiconductor chip.

The connection pad 140 may be disposed on the chip pad 134, and may be buried in the protective layer 150. A portion of the connection pad 140 may not be covered by the protective layer 150, and an exposed portion of the connection pad 140 may be directly connected to the bonding wire W. The chip pad 134 may be electrically connected to the upper pads 1003 and 1004 disposed at the upper surface of the package substrate 1002 by the connection pad 140 and the bonding wire W. The chip pad 134 and the connection pad 140 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag).

The adhesive member 1010 may be disposed between the package substrate 1002 and the semiconductor chip 100. The adhesive member 1010 may fix the semiconductor chip 100 to the upper surface of the package substrate 1002. The adhesive member 1010 may be a die attach film (DAF), without being limited thereto.

The encapsulator 1100 may cover the package substrate 1002, the semiconductor chip 100, and the bonding wire W. For example, the encapsulator 1100 may include a bisphenol-group epoxy resin, a polycyclic aromatic epoxy resin, an o-cresol novolac epoxy resin, a biphenyl-group epoxy resin, a naphthalene-group epoxy resin, or the like.

In accordance with the example embodiments of the inventive concepts, peeling of a semiconductor chip may be prevented or reduced.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:
1. A semiconductor chip, comprising:
a semiconductor substrate including a device region, and an edge region surrounding the device region;
a device layer on the semiconductor substrate;
a wiring layer on the device layer, wherein a side surface of the wiring layer at least partially defines a recessed region that is in the edge region such that the side surface of the wiring layer is exposed by the recessed region;
an upper insulating layer on the wiring layer; and
a protective layer on the upper insulating layer,
wherein the recessed region extends from a side surface of the device layer toward the device region,
wherein a cover portion of the upper insulating layer extends into the recessed region, covering the side surface of the wiring layer that is exposed by the recessed region, and
wherein the cover portion of the upper insulating layer is exposed by the protective layer such that the protective layer does not vertically overlap the cover portion of the upper insulating layer.
2. The semiconductor chip according to claim 1, wherein:
the recessed region is further at least partially defined by a portion of an upper surface of the device layer such that the portion of the upper surface of the device layer is exposed by the recessed region; and
a second portion of the upper insulating layer covers the portion of the upper surface of the device layer that is exposed by the recessed region.
3. The semiconductor chip according to claim 1, wherein:
the upper insulating layer includes a first upper insulating layer, a second upper insulating layer and a third upper insulating layer sequentially stacked; and
the recessed region is further at least partially defined by a side surface of the first upper insulating layer and a side surface of the second upper insulating layer such that the side surface of the first upper insulating layer and the side surface of the second upper insulating layer are each exposed by the recessed region.
4. The semiconductor chip according to claim 3, wherein the third upper insulating layer includes the cover portion, and the cover portion covers the side surface of the wiring layer, the side surface of the first upper insulating layer, and the side surface of the second upper insulating layer that are each exposed by the recessed region.

5. The semiconductor chip according to claim 3, wherein an upper end of the recessed region is at a same level as an upper surface of the second upper insulating layer.

6. The semiconductor chip according to claim 1, wherein, in plan view, the recessed region extends along an edge of the device layer.

7. The semiconductor chip according to claim 1, wherein:
the recessed region includes a plurality of recessed regions; and
the plurality of recessed regions are spaced apart from one another.

8. The semiconductor chip according to claim 1, further comprising:
a dam structure in the wiring layer and the upper insulating layer,
wherein the dam structure is in the edge region and extends to surround the device region.

9. The semiconductor chip according to claim 8, wherein the recessed region is outside the dam structure.

10. The semiconductor chip according to claim 1, further comprising:
a cover structure covering the side surface of the wiring layer that is exposed by the recessed region.

11. The semiconductor chip according to claim 10, wherein an upper end of the cover structure is at a same level as an upper surface of the wiring layer.

12. The semiconductor chip according to claim 10, wherein:
the upper insulating layer includes a first upper insulating layer, a second upper insulating layer and a third upper insulating layer sequentially stacked;
the first upper insulating layer includes a first upper cover portion covering the cover structure;
the second upper insulating layer includes a second upper cover portion covering the first upper cover portion; and
the third upper insulating layer includes a third upper cover portion covering the second upper cover portion.

13. The semiconductor chip according to claim 12, wherein a portion of the wiring layer extends between the cover structure and the first upper cover portion.

14. The semiconductor chip according to claim 13, wherein:
the wiring layer includes a lower insulating layer, and an upper interlayer insulating layer on the lower insulating layer;
the lower insulating layer includes a lower insulating layer cover portion covering the cover structure; and
the upper interlayer insulating layer includes an upper interlayer insulating layer cover portion that is between the lower insulating layer cover portion of the lower insulating layer and the first upper cover portion.

15. A semiconductor package, comprising:
a package substrate including an upper pad and an outer connection terminal, the upper pad being at an upper surface of the package substrate, and the outer connection terminal being at a bottom surface of the package substrate;
the semiconductor chip according to claim 1 on the package substrate;
a bonding wire connecting the semiconductor chip to the upper pad;
an adhesive member that is between the package substrate and the semiconductor chip; and
an encapsulator covering the package substrate and the semiconductor chip.

16. The semiconductor package according to claim 15, wherein:
the semiconductor chip further includes
a chip pad in the upper insulating layer,
a connection pad on the chip pad, and
the protective layer partially covering the connection pad; and
the connection pad is connected to the bonding wire.

17. A semiconductor chip, comprising:
a semiconductor substrate including a device region, and an edge region surrounding the device region;
a device layer on the semiconductor substrate;
a wiring layer on the device layer, wherein a side surface of the wiring layer at least partially defines a recessed region that is in the edge region such that the side surface of the wiring layer is exposed by the recessed region; and
an upper insulating layer on the wiring layer,
wherein the recessed region extends from a side surface of the device layer toward the device region,
wherein a first portion of the upper insulating layer covers the side surface of the wiring layer that is exposed by the recessed region,
wherein the upper insulating layer includes a first upper insulating layer, a second upper insulating layer and a third upper insulating layer sequentially stacked,
wherein the first upper insulating layer includes a first upper cover portion that is in the recessed region,
wherein the second upper insulating layer includes a second upper cover portion that is in the recessed region, and
wherein the third upper insulating layer includes a third upper cover portion that is in the recessed region.

18. The semiconductor chip according to claim 17, wherein:
the first upper cover portion covers the side surface of the wiring layer exposed by the recessed region; and
the second upper cover portion covers the first upper cover portion, and the third upper cover portion covers the second upper cover portion.

19. The semiconductor chip according to claim 18, wherein a portion of the first upper cover portion is not covered by the second upper cover portion.

20. A semiconductor chip, comprising:
a semiconductor substrate including a device region, and an edge region surrounding the device region;
a device layer on the semiconductor substrate;
a wiring layer on the device layer, wherein a side surface of the wiring layer at least partially defines a recessed region that is in the edge region such that the side surface of the wiring layer is exposed by the recessed region; and
an upper insulating layer on the wiring layer,
wherein the recessed region extends from a side surface of the device layer toward the device region,
wherein a first portion of the upper insulating layer covers the side surface of the wiring layer that is exposed by the recessed region,
wherein a cover structure covers the side surface of the wiring layer that is exposed by the recessed region, and
wherein an upper end of the recessed region is at a same level as an upper surface of the wiring layer.

* * * * *